United States Patent
Seguchi

(10) Patent No.: US 11,226,530 B2
(45) Date of Patent: Jan. 18, 2022

(54) ACTIVE MATRIX SUBSTRATE AND METHOD FOR MANUFACTURING ACTIVE MATRIX SUBSTRATE

(71) Applicant: SHARP KABUSHIKI KAISHA, Sakai (JP)

(72) Inventor: Yoshihiro Seguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/125,174

(22) Filed: Dec. 17, 2020

(65) Prior Publication Data

US 2021/0191207 A1    Jun. 24, 2021

Related U.S. Application Data

(60) Provisional application No. 62/952,982, filed on Dec. 23, 2019.

(51) Int. Cl.
 *G02F 1/1368* (2006.01)
 *G02F 1/1362* (2006.01)
 *H01L 27/12* (2006.01)

(52) U.S. Cl.
 CPC ...... *G02F 1/136286* (2013.01); *G02F 1/1368* (2013.01); *H01L 27/124* (2013.01); *H01L 27/127* (2013.01); *H01L 27/1248* (2013.01); *H01L 27/1288* (2013.01)

(58) Field of Classification Search
 CPC .................................................. G02F 1/136286
 See application file for complete search history.

(56) References Cited

U.S. PATENT DOCUMENTS

| | | | |
|---|---|---|---|
| 2004/0051101 A1* | 3/2004 | Hotta | H01L 27/127 257/72 |
| 2010/0187532 A1 | 7/2010 | Nagano et al. | |
| 2019/0157461 A1* | 5/2019 | Yamazaki | H01L 29/78693 |
| 2021/0210578 A1* | 7/2021 | Chen | H01L 27/3272 |

FOREIGN PATENT DOCUMENTS

JP    2010191410 A    9/2010

* cited by examiner

*Primary Examiner* — Sang V Nguyen
(74) *Attorney, Agent, or Firm* — ScienBiziP, P.C.

(57) ABSTRACT

A pixel electrode is formed from a transparent conducting film. A gate insulating layer includes a region including a portion of a thin-film transistor that makes contact with a semiconductor layer and a thinned region. The pixel electrode is disposed over a part of the thinned region. A dielectric layer is in direct contact with another part of the thinned region. An upper surface of the gate insulating layer has a stepped portion. The stepped portion includes a stepped portion that extends flush with a side surface of a lower layer of a drain electrode. The pixel electrode extends over at least a part of the stepped portion and at least a part of the side surface of the lower layer of the drain electrode from above the thinned region and is connected to an upper layer of the drain electrode.

6 Claims, 23 Drawing Sheets

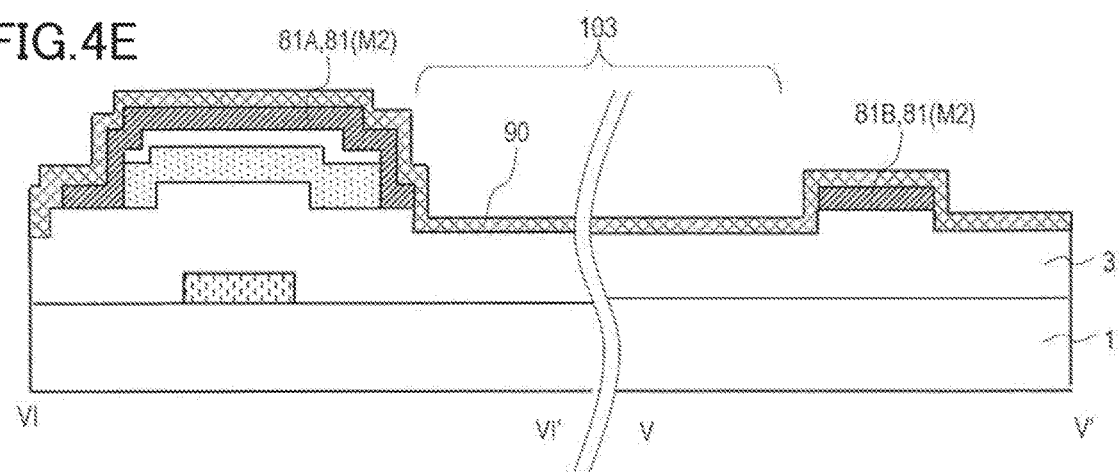
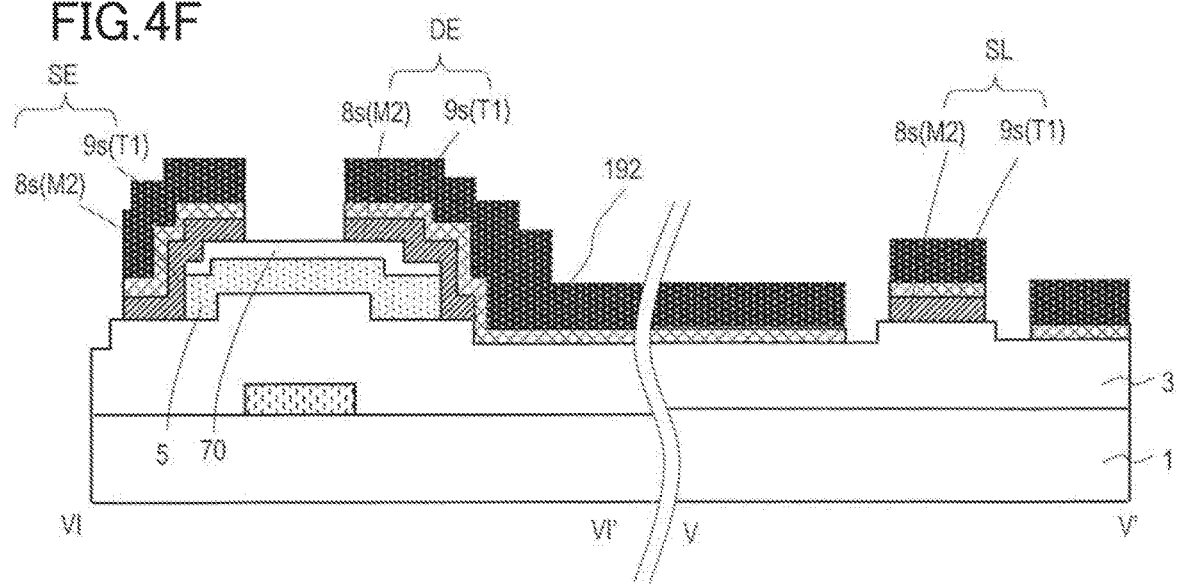
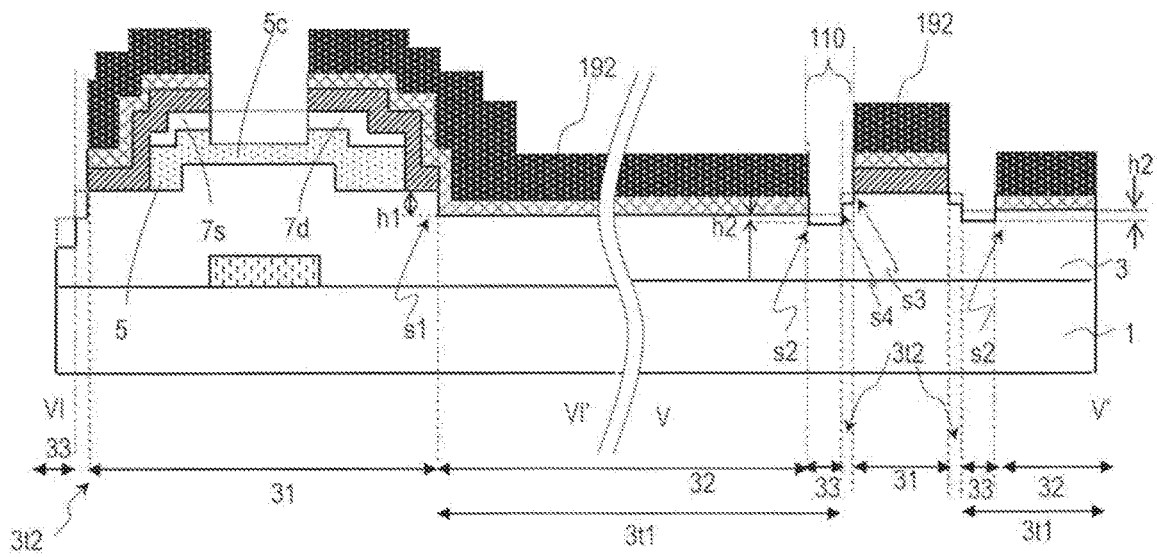

ACTIVE MATRIX SUBSTRATE AND METHOD FOR MANUFACTURING ACTIVE MATRIX SUBSTRATE

TECHNICAL FIELD

The present invention relates to an active matrix substrate and a method for manufacturing an active matrix substrate.

BACKGROUND ART

In general, an active matrix liquid crystal display device includes a substrate (hereinafter called "active matrix substrate") having a thin-film transistor (hereinafter also called "TFT") formed as a switching element for each pixel, a counter substrate having formed therein a counter electrode, a color filter, and the like, a liquid crystal layer provided between the active matrix substrate and the counter substrate, and a pair of electrodes (namely an pixel electrode and a common electrode) through which to apply a voltage to the liquid crystal layer. It should be noted that a portion of the active matrix substrate that corresponds to a pixel of the display device is herein sometimes called "pixel". Further, a TFT provided as a switching element for each pixel of the active matrix substrate is called "pixel TFT".

Various operation modes have been proposed for and adopted into active matrix liquid crystal display devices according to the purposes for which the devices are used. Known examples of operation modes include transverse electric field modes such as an IPS (in-plane switching) mode and an FFS (fringe field switching) mode. Under a transverse electric field scheme, an active matrix substrate is provided with a pixel electrode and a common electrode, and an electric field is applied to liquid crystal molecules in a direction (transverse direction) parallel to a board surface.

In a liquid crystal display device of the FFS mode, which is one of the transverse electric field operation modes, a pixel electrode and a common electrode are disposed so as to overlap each other via an insulating film (dielectric layer), so that a higher aperture ratio and a higher transmittance can be achieved than in a liquid crystal display device of the IPS mode. Further, in the FFS mode, a capacitance is formed in a place where the pixel electrode and the common electrode overlap each other via the dielectric layer. This capacitance may have a function as an auxiliary capacitance (hereinafter called "transparent auxiliary capacitance") in the display device.

PTL 1 discloses an active matrix substrate that is used in the FFS mode. In the active matrix substrate disclosed in PTL 1, a source bus line and source and drain electrodes of a pixel TFT each have a laminated structure including a lower layer composed of a metal film (called "source conducting film") and an upper layer composed of a transparent conducting film for use in a pixel electrode. In PTL 1, in manufacturing such an active matrix substrate, a resist mask (source mask) that is used in patterning of the source conducting film is utilized to perform patterning of a semiconductor film that serves as an active layer of the pixel TFT and a contact film that serves as a contact layer of the pixel TFT. Further, a resist mask (pixel electrode mask) that is used in patterning of the transparent conducting film is utilized to perform etching by which the source conducting film and the contact film are separated into a source side and a drain side, so that a portion of the active layer that serves as a channel is exposed. This makes it possible to reduce the number of photomasks that are used (i.e. the number of photolithography steps).

CITATION LIST

Patent Literature

[PTL 1] Japanese Unexamined Patent Application Publication No. 2010-191410

SUMMARY OF DISCLOSURE

Technical Problem

According to a study by the inventor, a conventional process for manufacturing an active matrix substrate may reduce yields due to leak defects, display defects, and the like that are described below.

In the step of patterning a semiconductor film and a contact film (laminated semiconductor film) by which an active layer and a contact layer of a TFT are formed, dust or foreign matter may adhere onto a laminated semiconductor film to act as a mask. As a result, there is a risk that a part of the laminated semiconductor film may remain over the substrate without being etched (etching residue) and reduce yields. For example, in the presence of an etching residue in a gap portion between a pixel electrode and a source bus line, there is a possibility that a leak may occur between the pixel electrode and the source bus line (leak defect). Alternatively, in the presence of an etching residue below a pixel electrode, an irregular reflection of light off the etching residue may cause a spot defect that makes even a black display appear bright.

Further, in the active matrix substrate disclosed in PTL 1, a part of the dielectric layer located between the pixel electrode and the common electrode is disposed so as to make direct contact with a gate insulating layer that has a comparatively high film stress. For this reason, when the dielectric layer is thin, there is a risk that adhesion with the gate insulating layer may decrease. Meanwhile, when the dielectric layer is made thicker for securement of sufficient adhesion with the gate insulating layer, the aforementioned transparent auxiliary capacitance becomes smaller, so that there is a possibility that a shadowing or flicker display defect may tend to occur.

Furthermore, as will be described in detail later, the conventional manufacturing process poses a risk that a part of the contact film may be altered to form a silicon product that remains as a residue on the active layer of the pixel TFT. This may be a factor in the occurrence of a source-drain leak.

An embodiment of the present invention has as an object to provide an active matrix substrate that is capable of improving yields by reducing defects such as leak defects and display defects such as those described above and a method for manufacturing such an active matrix substrate.

Solution to Problem

Disclosed herein are an active matrix substrate and a method for manufacturing an active matrix substrate according to the following items.

[Item 1]

An active matrix substrate having a display region including a plurality of pixel regions, the active matrix substrate including:

a substrate;

a plurality of source bus lines, supported by the substrate, that extend in a first direction; and a plurality of gate bus lines that extend in a second direction crossing the first direction, wherein each of the plurality of pixel regions has a thin-film transistor having a gate electrode supported by the substrate, a semiconductor layer disposed over the gate electrode via a gate insulating layer, a source electrode disposed over a part of the semiconductor layer via a source contact layer, and a drain electrode disposed over another part of the semiconductor layer via a drain contact layer, a pixel electrode disposed over the gate insulating layer, and a common electrode disposed over the pixel electrode via a dielectric layer, in each of the plurality of pixel regions, the source electrode and the drain electrode of the thin-film transistor each have a laminated structure including a lower layer formed from a source conducting film and an upper layer formed from a first transparent conducting film, the pixel electrode is formed from the first transparent conducting film, the gate insulating layer includes a first region including a portion of the thin-film transistor that makes contact with the semiconductor layer and a first thinned region that is thinner than the first region, the pixel electrode is disposed over a part of the first thinned region, the dielectric layer is in direct contact with another part of the first thinned region, an upper surface of the gate insulating layer has a stepped portion that serves as a boundary between the first region and the first thinned region, when seen from a direction of a normal to the substrate, the stepped portion includes a first stepped portion that extends flush with a side surface of the lower layer of the drain electrode, and the pixel electrode extends over at least a part of the first stepped portion and at least a part of the side surface of the lower layer of the drain electrode from above the first thinned region and is connected to the upper layer of the drain electrode.

[Item 2]

The active matrix substrate according to Item 1, wherein in each of the plurality of pixel regions, the first thinned region of the gate insulating layer includes a second region and a third region that is thinner than the second region, the upper surface of the gate insulating layer further has a second stepped portion that serves as a boundary between the second region and the third region, the pixel electrode is disposed over the second region, the dielectric region is in contact with the third region, and when seen from the direction of the normal to the substrate, at least a part of the second stepped portion is flush with a side surface of the pixel electrode.

[Item 3]

The active matrix substrate according to Item 2, wherein a height h1 of the first stepped portion is greater than a height h2 of the second stepped portion.

[Item 4]

The active matrix substrate according to any of Items 1 to 3, wherein the dielectric layer has a laminated structure including a lower dielectric layer that makes direct contact with the gate insulating layer and an upper dielectric layer disposed over the lower dielectric layer, either one of the lower dielectric layer and the upper dielectric layer has a compressive stress, and the other one of the lower dielectric layer and the upper dielectric layer has a tensile stress.

[Item 5]

The active matrix substrate according to Item 4, wherein the gate insulating layer has a compressive stress, the lower dielectric layer has a compressive stress, and the upper dielectric layer has a tensile stress.

[Item 6]

The active matrix substrate according to Item 2 or 3, wherein the plurality of source bus lines each have a laminated structure including a lower line formed from the source conducting film and an upper line formed from the first transparent conducting film, the source electrode of each of the pixel regions is electrically connected to one of the plurality of source bus lines, and the lower line of the one source bus line is in direct contact with the first region of the gate insulating layer.

[Item 7]

The active matrix substrate according to Item 6, wherein in each of the pixel regions, when seen from the direction of the normal to the substrate, the third region of the gate insulating layer is located between the pixel electrode and the one source bus line.

[Item 8]

The active matrix substrate according to Item 7, wherein in each of the pixel regions, when seen from the direction of the normal to the substrate, the gate insulating layer further has a second thinned region that extends along a peripheral edge of the one source bus line between the third region and the one source bus line, the second thinned region is thinner than the first region and thicker than the first thinned region, and the second thinned region is in direct contact with the dielectric layer.

[Item 9]

The active matrix substrate according to any of Items 6 to 8, further comprising an island-shaped semiconductor section disposed between the one source bus line and the gate insulating layer and separated from both the semiconductor layer and the pixel electrode.

[Item 10]

The active matrix substrate according to any of Items 6 to 8, wherein the semiconductor layer includes a first source semiconductor section extended between the one source bus line and the gate insulating layer, the source contact layer includes a second source semiconductor section extended between the one source bus line and the gate insulating layer and located over the first source semiconductor section, and the one source bus line covers upper and side surfaces of a laminated body composed of the first source semiconductor section and the second source semiconductor section and is in contact with the gate insulating layer.

[Item 11]

The active matrix substrate according to any of Items 1 to 10, wherein a height h1 of the first stepped portion is greater than or equal to 100 nm and less than or equal to 150 nm.

[Item 12]

The active matrix substrate according to any of Items 2, 3, and 6 to 10, wherein a height h2 of the second stepped portion is greater than or equal to 20 nm and less than or equal to 40 nm.

[Item 13]

A method for manufacturing the active matrix substrate according to Item 1, the method including:

a first thinning step of, after having performed patterning of a semiconductor film by which the semiconductor layer of the thin-film transistor is formed and a contact semiconductor film by which the source contact layer and the drain contact layer are formed, performing thinning of the gate insulating layer by using a first mask for patterning the source conducting film or using as a mask the source conducting film patterned using the first mask; and a second thinning step of performing thinning of the gate insulating layer by using a second mask for patterning the first transparent conducting film or using as a mask the first transparent conducting film patterned using the second mask.

[Item 14]

The method according to Item 13, wherein the first thinning step is executed under etching conditions where residues of the semiconductor film and the contact semiconductor film left over the gate insulating layer are removable through thicknesses thereof.

[Item 15]

A method for manufacturing an active matrix substrate having a display region including a plurality of pixel regions and including a thin-film transistor and a pixel electrode disposed in each of the plurality of pixel regions, the method including, in each of the plurality of pixel regions:

(a) a step of forming, over a substrate, a gate metal layer including a gate electrode of the thin-film transistor;

(b) a step of forming a gate insulating layer that covers the gate metal layer;

(c) a step forming a semiconductor layer and a contact semiconductor layer of the thin-film transistor by performing patterning of a semiconductor film and a contact semiconductor film after having formed the semiconductor film and the contact semiconductor film in this order over the gate insulating layer;

(d) a step of forming a first mask over a part of a source conducting film after having formed the source conducting film so that the source conducting film covers the semiconductor layer and the contact semiconductor layer of the thin-film transistor;

(e) a step of forming a source conducting layer by performing patterning of the source conducting film by wet etching using the first mask, the source conducting layer covering upper and side surfaces of a laminated body composed of the semiconductor layer and the contact semiconductor layer;

(f) a first thinning step of performing thinning of the gate insulating layer by dry etching using the first mask or using the source conducting layer as a mask;

(g) a step of forming a second mask over a part of a first transparent conducting film after having formed the first transparent conducting film so that the first transparent conducting film covers the gate insulating layer and the source conducting layer;

(h) a step of performing patterning of the first transparent conducting layer and the source conducting layer by wet etching using the second mask, the step causing a first transparent conducting layer to be formed from the first transparent conducting film and a source metal layer to be formed from the source conducting layer, the first transparent conducting layer including an upper layer of a source electrode and an upper layer of a drain electrode of the thin-film transistor, the source metal layer including a lower layer of the source electrode and a lower layer of the drain electrode of the thin-film transistor;

(i) a second thinning step of exposing the semiconductor layer by removing, by dry etching using the second mask or using the first transparent conducting layer and the source metal layer as masks, a portion of the contact semiconductor layer that is not covered with the source electrode or the drain electrode and performing thinning of the gate insulating layer;

(j) a step of forming a dielectric layer so that the dielectric layer covers the pixel electrode and the thin-film transistor and makes direct contact with an upper surface of the gate insulating layer; and (k) a step of forming, over the dielectric layer, a second transparent conducting layer including a common electrode.

[Item 16]

The method according to Item 15, wherein in the step (f), the first thinning step is executed under etching conditions where residues of the semiconductor film and the contact semiconductor film left over the gate insulating layer are removable through thicknesses thereof.

[Item 17]

The method according to Item 15 or 16, wherein the step (j) includes a step of forming a lower dielectric layer that makes direct contact with the upper surface of the gate insulating layer and a step of forming an upper dielectric layer over the lower dielectric layer, thereby causing the dielectric layer to be formed to have a laminated structure including the lower dielectric layer and the upper dielectric layer, either one of the lower dielectric layer and the upper dielectric layer has a compressive stress, and the other one of the lower dielectric layer and the upper dielectric layer has a tensile stress.

[Item 18]

The method according to Item 17, wherein the gate insulating layer has a compressive stress, the lower dielectric layer has a compressive stress, and the upper dielectric layer has a tensile stress.

[Item 19]

The method according to Item 17 or 18, wherein the gate insulating layer is a silicon nitride layer formed at a first temperature Ta, the lower dielectric layer is a silicon nitride layer formed at a second temperature Tb, the upper dielectric layer is a silicon nitride layer formed at a third temperature Tc, and the first temperature Ta, the second temperature Tb, and the third temperature Tc satisfy Ta>Tb>Tc.

Advantageous Effects of Disclosure

An embodiment of the present invention provides an active matrix substrate that is capable of improving yields and a method for manufacturing such an active matrix substrate.

BRIEF DESCRIPTION OF DRAWINGS

FIG. 4E is a step cross-sectional view taken along lines IV-IV' and V-V' for explaining the method for manufacturing an active matrix substrate 100.

FIG. 4F is a step cross-sectional view taken along lines IV-IV' and V-V' for explaining the method for manufacturing an active matrix substrate 100.

FIG. 4G is a step cross-sectional view taken along lines IV-IV' and V-V' for explaining the method for manufacturing an active matrix substrate 100.

DESCRIPTION OF EMBODIMENTS

Active matrix substrates according to embodiments of the present invention and methods for manufacturing such active matrix substrates are described below with reference to the drawings.

Embodiment 1

An active matrix substrate of Embodiment 1 is for example an active matrix substrate that is used in a liquid crystal display device of the FFS mode. It should be noted that the active matrix substrate of the present embodiment needs only have a TFT and two transparent conducting layers over a substrate and widely encompasses active matrix substrates that are used in various types of display device and electronic device and the like.

Figure 1:
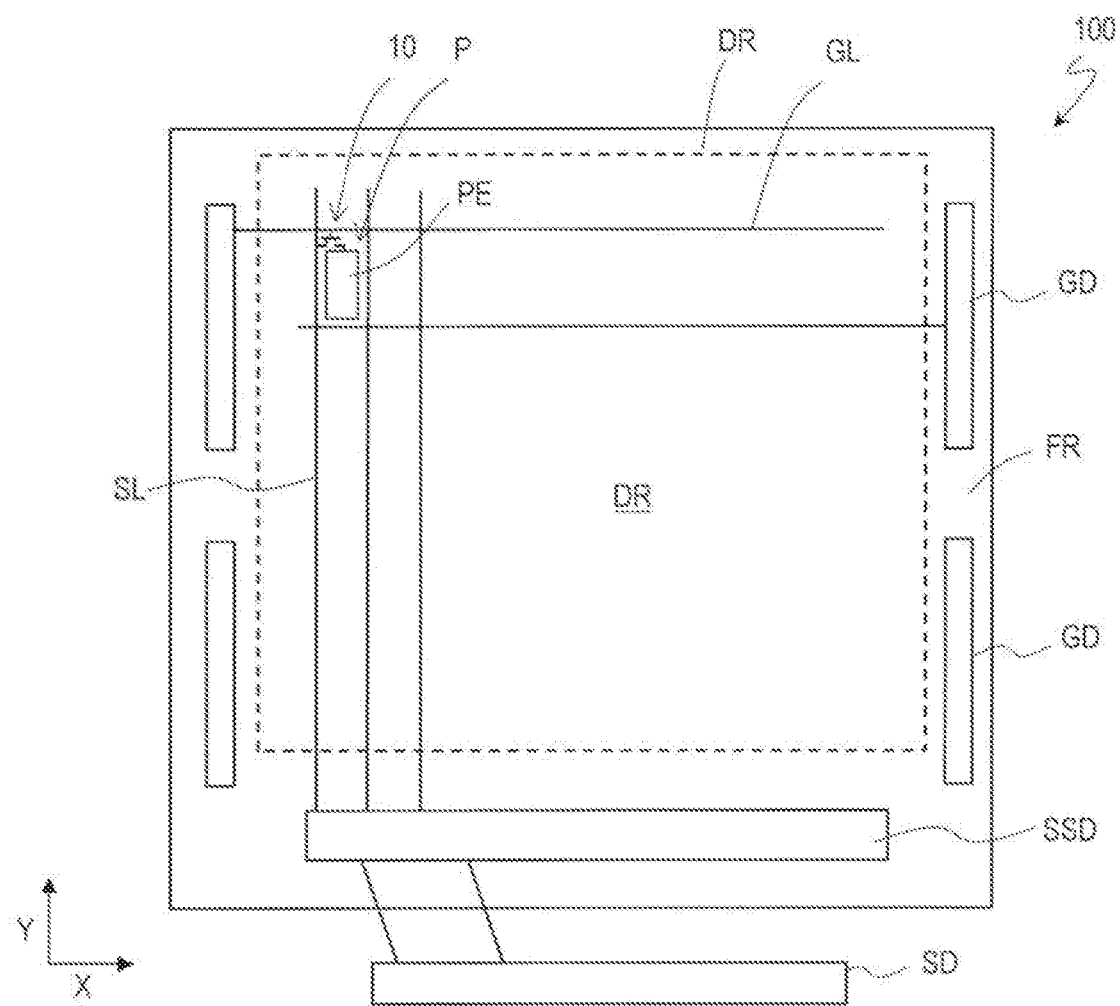
FIG. 1 is a diagram schematically showing an example of a planar structure of an active matrix substrate 100 of Embodiment 1.

FIG. 1 is a diagram schematically showing an example of a planar structure of an active matrix substrate 100 of the present embodiment. The active matrix substrate 100 has a display region DR that contributes to a display and a peripheral region (frame region) FR located outside the display region DR.

The display region DR is provided with a plurality of source bus lines SL extending in a first direction (y direction) and a plurality of gate bus lines GL extending in a second direction (x direction) crossing (in this example, orthogonal to) the first direction. Each region surrounded by these bus lines serves as a "pixel region P". The pixel region P (sometimes called "pixel") is a region that corresponds to a pixel of a display device. A plurality of the pixel regions P are arranged in a matrix. Each pixel region P has formed therein a pixel electrode PE and a thin-film transistor (TFT) 10. Each TFT 10 has its gate electrode electrically connected to a corresponding gate bus line GL and its source electrode electrically connected to a corresponding source bus line SL. Further, each TFT 10 has its drain electrode electrically connected to the pixel electrode PE. In the present embodiment, a common electrode (not illustrated) is provided above the pixel electrode PE via an insulating layer (hereinafter called a "dielectric layer").

In the peripheral region FR, for example, drive circuits such as a gate driver GD and a source driver SD, an SSD circuit, a plurality of terminal areas, a plurality of source-gate connections, and the like are disposed. The gate driver GD and the source driver SD may be monolithically formed or mounted in the active matrix substrate 100.

Next, a structure of each pixel region P in the active matrix substrate 100 of the present embodiment is more specifically described with reference to the drawings. Although the active matrix substrate 100 has a plurality of the pixel regions P, the following describes a single pixel region P.

Figure 2A:
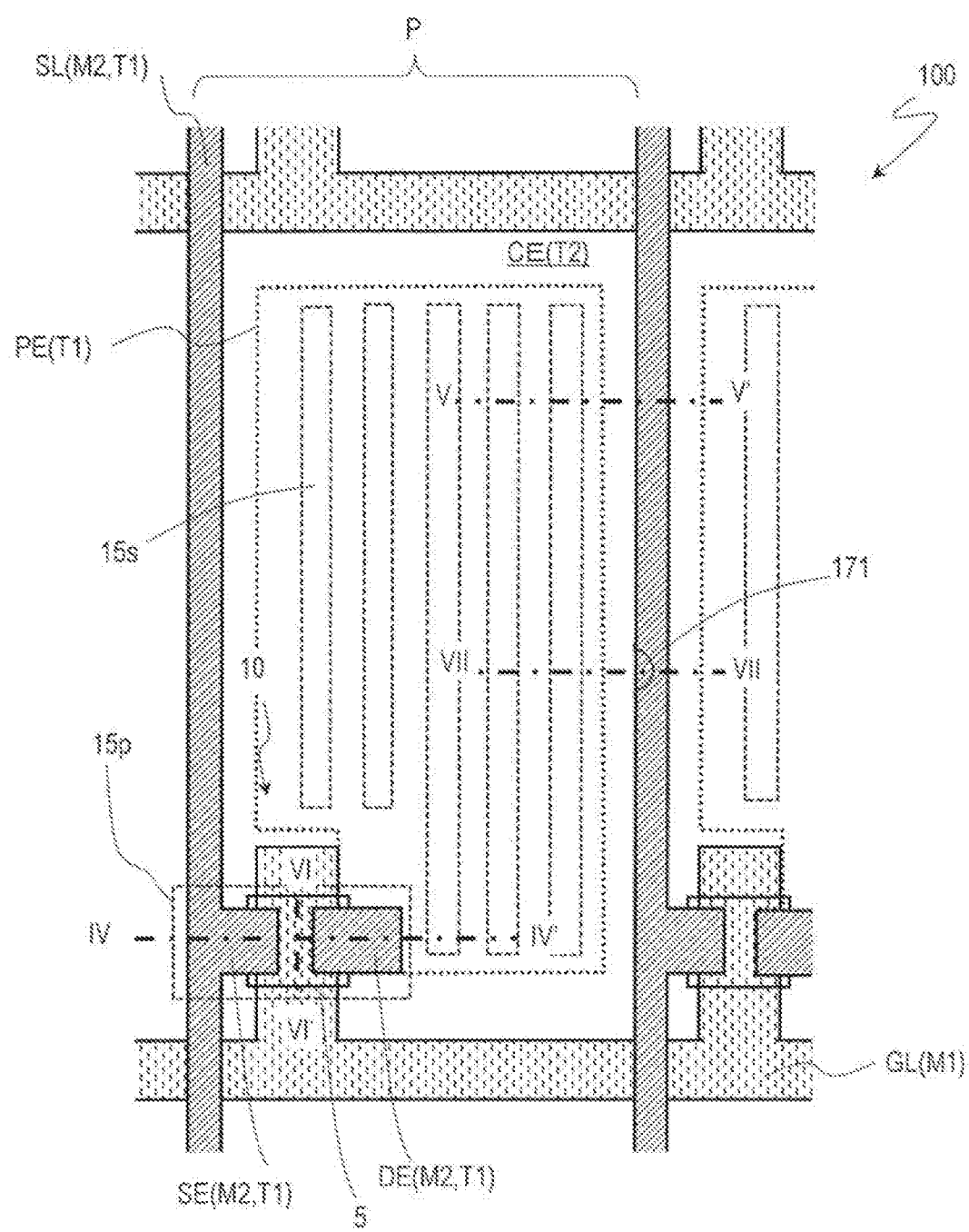
FIG. 2A is a plan view illustrating each pixel region P in the active matrix substrate 100.
Figure 2B:
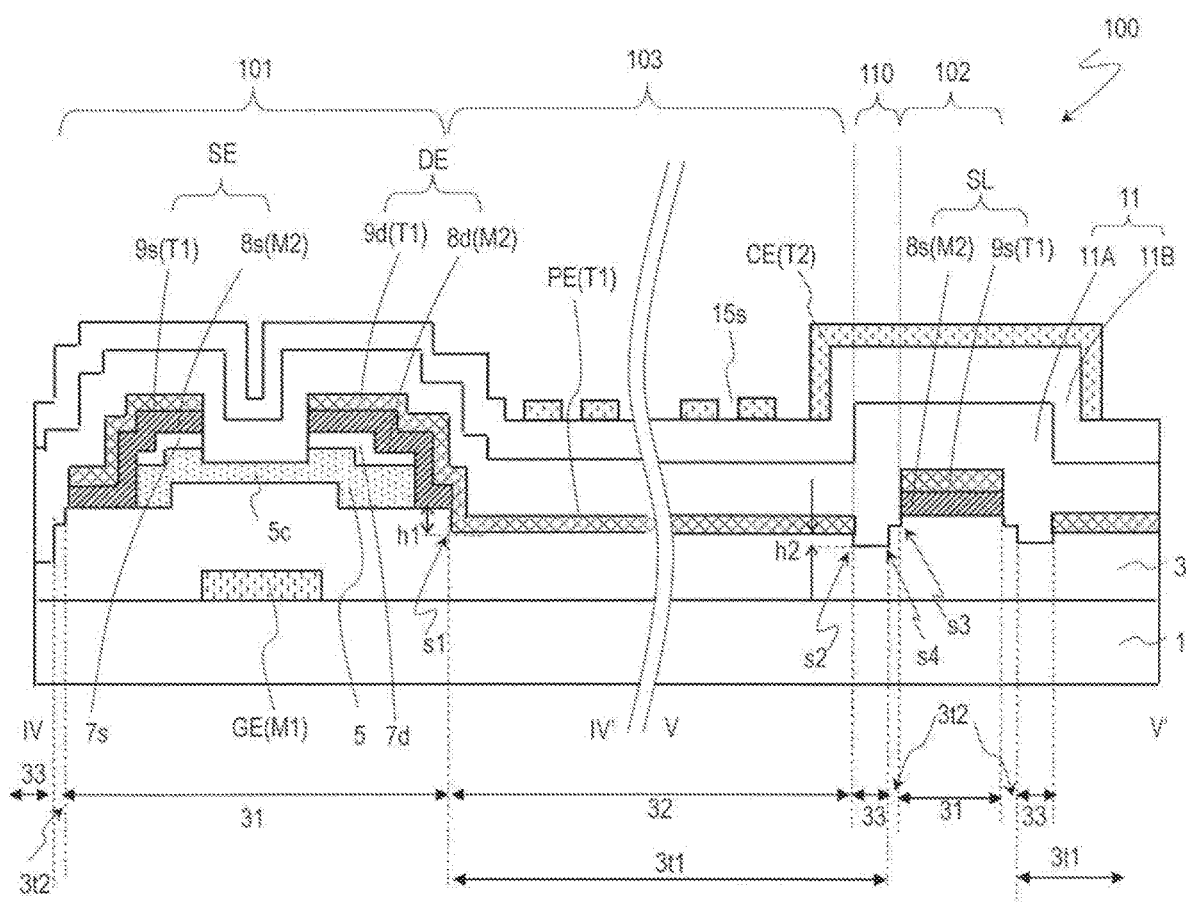
FIG. 2B is a cross-sectional view taken along lines IV-IV' and V-V' shown in FIG. 2A.
Figure 2C:
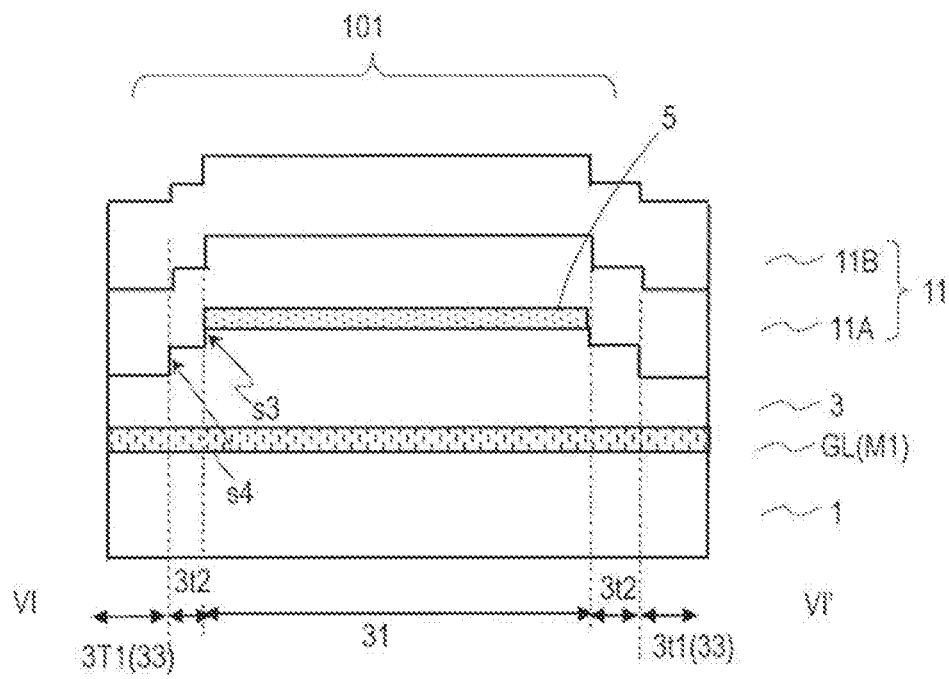
FIG. 2C is a cross-sectional view taken along line VI-VI' shown in FIG. 2A.

FIG. 2A is a plan view illustrating each pixel region P in the active matrix substrate 100. FIG. 2B is a cross-sectional view taken along line VI-VI' across the TFT 10 in a channel length direction in a region (TFT formation region) 101 where the TFT 10 is formed and line V-V' across the source bus line SL in a region (source bus line formation region) 102 where the source bus line SL is formed. FIG. 2C is a cross-sectional view taken along line VI-VI' across the TFT 10 in a channel width direction in the TFT formation region 101.

Figure 2D:
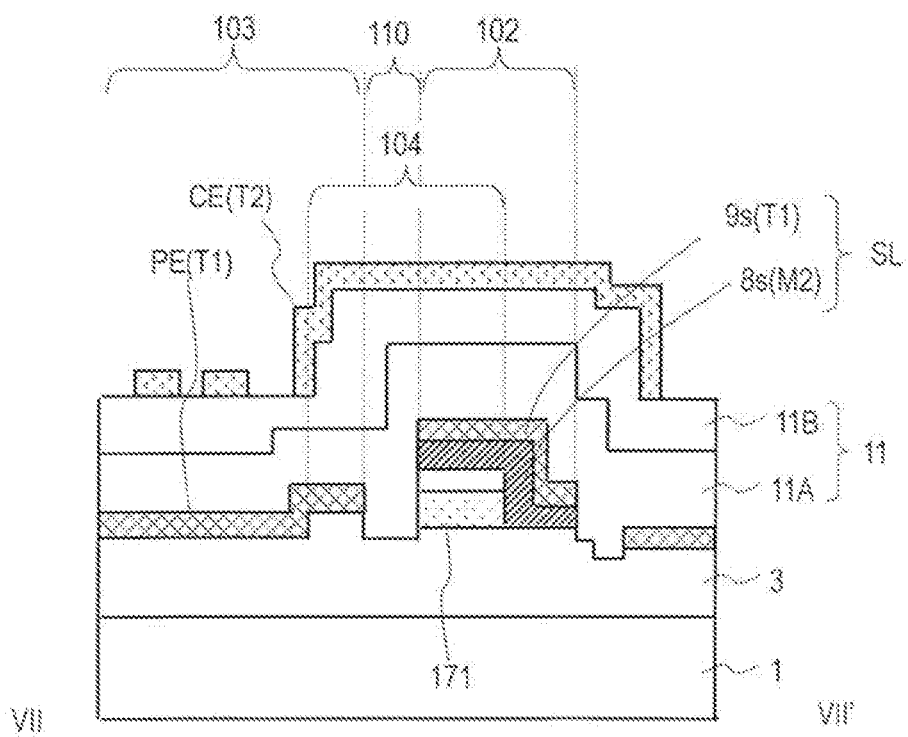
FIG. 2D is a cross-sectional view of an etching residue appearance region 104 as taken along line VII-VII' shown in FIG. 2A.

Further, FIG. 2D is a cross-sectional view taken along line VII-VII' across the source bus line SL in a region (etching residue appearance region) 104 where an etching residue has appeared. Illustrated here is a cross-sectional structure that is finally obtained in a case where a residue of a laminated semiconductor film (hereinafter referred to as "semiconductor residual part") has appeared so as to make a connection between a pixel electrode formation region 103 where the pixel electrode PE is formed and the source bus line formation region 102.

A layer M1 including electrodes and wires formed using the same conducting film (hereinafter referred to as "gate conducting film") as the gate bus lines GL, a layer M2 including electrodes and wires formed using the same conducting film (hereinafter referred to as "source conducting film") as the main layers of the source bus lines SL, a layer T1 including electrodes and wires formed using the same transparent conducting film (hereinafter referred to as "first transparent conducting film") as the pixel electrodes, and a layer T2 including electrodes and wires formed using the same transparent conducting film (hereinafter referred to as "second transparent conducting film") as the common electrode are herein referred to as "gate metal layer", "source metal layer", "first transparent conducting layer", and "second transparent conducting layer", respectively. In the drawings, the layers in parentheses indicate in which of the layers each constituent element is formed.

The pixel region P is for example a region surrounded by source bus lines SL and gate bus lines GL extending in a direction crossing the source bus lines SL. The pixel region P has a substrate 1, a pixel TFT (hereinafter simply referred to as "TFT") 10 supported by the substrate 1, a pixel electrode PE, and a common electrode CE. The pixel TFT 10 needs only be associated with the pixel region P, and a part of the pixel TFT 10 may be located in another pixel region. The common electrode CE is disposed over the pixel electrode PE via a dielectric layer (also referred to as "interlayer insulating layer") 11.

The TFT 10 is a TFT of a bottom-gate channel-etch structure. The TFT 10 includes a gate electrode GE disposed over the substrate 1, a gate insulating layer 3 covering the gate electrode GE, a semiconductor layer 5 disposed over the gate electrode GE via the gate insulating layer 3, a source electrode SE electrically connected to the semiconductor layer 5, and a drain electrode DE electrically connected to the semiconductor layer 5. The gate electrode GE is electrically connected to a corresponding gate bus line GL, and the source electrode SE is electrically connected to a corresponding source bus line SL. The drain electrode DE is connected to the pixel electrode PE. The gate electrode GE may be formed integrally with the corresponding gate bus line GL, and the source electrode SE may be formed integrally with the corresponding source bus line SL.

Over the semiconductor layer 5, a source contact layer 7s and a drain contact layer 7d are disposed. The source contact layer 7s and the drain contact layer 7d are disposed on both sides, respectively, of a region (channel region) 5c of the semiconductor layer 5 where a channel is formed. The source electrode SE is disposed over the semiconductor layer 5 via the source contact layer 7s. The drain electrode DE is disposed over the semiconductor layer 5 via the drain contact layer 7d. The source electrode SE may be provided so as to make contact with the source contact layer 7s, and the drain electrode DE may be provided so as to make contact with the drain contact layer 7d.

A first portion (including the channel region 5c) of the semiconductor layer 5 that is not covered with the source contact layer 7s or the drain contact layer 7d may be surface-etched. In this case, the first portion is thinner in thickness than a second portion of the semiconductor layer 5 covered with the source contact layer 7s and the drain contact layer 7d.

The source contact layer 7s and the drain contact layer 7d are formed, for example, from a contact semiconductor film containing an n-type impurity in a higher concentration than the semiconductor layer 5. The semiconductor layer 5 may be an intrinsic amorphous silicon (i-a-Si) layer, and the source contact layer 7s and the drain contact layer 7d may be n$^+$ amorphous silicon (n$^+$-a-Si) layers.

The gate electrode GE and the gate bus line GL are formed within the gate metal layer M1 (using the gate conducting film). The gate electrode GE may be a part of the gate bus line GL or may be connected to the gate bus line GL. The source electrode SE and the source bus line SL have a laminated structure including a lower layer 8s formed within the source metal layer M2 (using the source conducting film) and an upper layer 9s formed within the first transparent contacting layer T1 (using the first transparent conducting film). The source electrode SE may be a part of the source line SL or may be connected to the source bus line SL. Similarly, the drain electrode DE too has a laminated structure including a lower layer 8d formed within the source metal layer M2 and an upper layer 9d formed within the first transparent conducting layer T1.

The lower layers 8s and 8d are herein sometimes collectively referred to as "lower layer 8", and the upper layers 9s and 9d are herein sometimes collectively referred to as "upper layer 9". In this example, the upper layer 9 is in direct contact with an upper surface of the lower layer 8. The lower layer 8 is a conducting layer (e.g. a metal layer) that is lower in resistance than the upper layer 9, and may function as a main layer of each electrode or wire. Further, the lower layer 8s and upper layer 9s of the source bus line SL are sometimes called "lower line" and "upper line", respectively.

In the illustrated example, the source electrode SE (or the source bus line SL) extends over a part of a side surface of the source contact layer 7s and a part of a side surface of the semiconductor layer 5 and is in contact with the gate insulating layer. Similarly, the drain electrode DE extends over a part of a side surface of the drain contact layer 7d and a part of a side surface of the semiconductor layer 5 and is in contact with the gate insulating layer 3.

The pixel electrode PE is formed within the first transparent conducting layer T1. The pixel electrode PE is electrically separated from a pixel electrode of an adjacent pixel region. Further, when seen from the direction of the normal to the substrate 1, the pixel electrode PE and the source bus line SL are placed at a spacing (called "gap portion") 110 from each other. Further, the pixel electrode PE extends from the pixel electrode formation region 103 into the TFT formation region 101 and is connected to (i.e. formed integrally with) the upper layer 9d of the drain electrode DE. Accordingly, the upper layer 9d of the drain electrode DE may function as a part of the pixel electrode PE.

The TFT 10 and the pixel electrode PE are covered with the dielectric layer 11. The dielectric layer 11 is in direct contact with the channel region 5c of the TFT 10 and the pixel electrode PE. Further, the dielectric layer 11 is in direct contact with a part of an upper surface of the gate insulating layer 3, i.e. a portion of the upper surface of the gate insulating layer 3 that is not covered with the semiconductor layer 5, the source metal layer M2, or the first transparent conducting layer T1. For example, the dielectric layer 11 is in direct contact with the gate insulating layer 3 in the gap portion 110 between the source bus line SL and the pixel PE.

The dielectric layer 11 is for example an inorganic insulating layer (passivation film). In this example, the dielectric layer 11 is a silicon nitride (SiN$_x$) layer. The dielectric layer 11 may have a laminated structure. In this example, the dielectric layer 11 has a laminated structure including a lower dielectric layer 11A and an upper dielectric layer 11B in this order from the substrate 1.

Over the dielectric layer 11, the common electrode CE is formed. The common electrode CE is formed within the second transparent conducting layer T2 (using the second transparent conducting film). The common electrode CE is provided with one or more slits (openings) 15s or notches for each pixel region P. Further, the common electrode CE may have an opening 15p in the TFT formation region 101. For example, the common electrode CE may be formed all over the pixel region P excluding the TFT formation region 101. The common electrode CE does not need to be separated for each pixel region P.

The pixel electrode PE and the common electrode CE are disposed so as to partially overlap each other via the dielectric layer 11. In the overlap between the pixel electrode PE and the common electrode CE, an auxiliary capacitance (transparent auxiliary capacitance) is formed by portions of the pixel electrode PE, the common electrode CE, and the dielectric layer 11 located between these electrodes.

In the present embodiment, the gate insulating layer 3 includes a first region 31 and a first thinned region 3t1 that is thinner than the first region 31. Over the first region 31, for example, the semiconductor layer 5 (channel region 5c) and the source bus line SL are disposed, and over the first thinned region 3t1, the pixel electrode PE is disposed.

In a process for manufacturing the active matrix substrate 100, the gate insulating layer 3 is thinned (called "first thinning step") using a mask (called "source mask" or "first mask") that is used in patterning of the source conducting film. The first thinned region 3t1 is a region thinned in the first thinning step. The first region 31 is a region kept as thick as it was at the time of formation of the semiconductor film without being etched (thinned) in the first thinning step.

The first region 31 may be as thick as it was at the time of formation of the gate insulating layer 3.

The first region 31 includes, for example, a portion of the gate insulating layer 3 that makes contact with the source bus line SL (or the source electrode SE), a portion of the gate insulating layer 3 that makes contact with the drain electrode DE, a portion of the gate insulating layer 3 that makes contact with the semiconductor layer 5, and the like. In this example, the semiconductor layer 5, the source bus line SL, the source electrode SE, and the drain electrode DE are in contact with the first region 31 of the gate insulating layer 3 but are not in contact with the first thinned region 3t1. Meanwhile, the first thinned region 3t1 is formed mainly in the pixel electrode formation region 103 and the gap portion 110. The first thinned region 3t1 includes a portion of the gate insulating layer 3 that makes contact with the dielectric layer 11, a portion of the gate insulating layer 3 that makes contact with the pixel electrode PE, and the like.

The upper surface of the gate insulating layer 3 has a first stepped portion (stepped surface) s1 that serves as a boundary between the first region 31 and the first thinned region 3t1. The first stepped portion s1 is formed by the first thinning step. When seen from the direction of the normal to the substrate 1, at least a part of the first stepped portion s1 is located closer to the outside than the semiconductor layer 5 and is flush with a side surface of the lower layer 8d of the drain electrode DE.

The pixel electrode PE is extended from above the first thinned region 3t1 of the gate insulating layer 3 so as to cover side surfaces of the first stepped portion s1 and the drain electrode DE and is connected to the upper layer 9d of the drain electrode DE.

The first thinned region 3t1 of the gate insulating layer 3 may include a second region 32 and a third region 33 that is thinner than the second region 32. A part of the first thinned region 3t1 may be further thinned (called "second thinning step") after the first thinning step using a mask (called "pixel electrode mask" or "second mask") that is used in patterning of the first transparent conducting film. The second region 32 is a region of the first thinned region 3t1 that was not thinned in the second thinning step (i.e. that was thinned only in the first thinning step). The third region 33 is a region further thinned in the second thinning step (i.e. thinned in both the first and second thinning steps).

The second region 32 may be disposed in the pixel electrode formation region 103, and the third region 33 may be disposed in the gap portion 110 of the gate insulating layer 3 between the source bus line SL and the pixel electrode PE. In this case, the pixel electrode PE is disposed over the second region 32. Further, the dielectric layer 11 is in direct contact with the third region 33 in the gap portion 110.

An upper surface of the first thinned region 3t1 of the gate insulating layer 3 may have a second stepped portion s2 serving as a boundary between the second region 32 and the third region 33. The second stepped portion s2 is formed in the second thinning step. When seen from the direction of the normal to the substrate 1, at least a part of the second stepped portion s2 may be flush with a side surface of the pixel electrode PE.

The gate insulating layer 3 may further has a second thinned region 3t2 that is thinner than the first region 31 and thicker than the first thinned region 3t1. The second thinned region 3t2 is a region thinned only in the second thinning step without being thinned in the first thinning step. In this example, for example, when seen from the direction of the normal to the substrate 1, the second thinned region 3t2 is formed along a peripheral edge of the source bus lines SL. When seen from the direction of the normal to the substrate 1, the second thinned region 3t2 is located, for example, between the source bus line SL and the third region 33. The upper surface of the gate insulating layer 3 further has a third stepped portion s3 that serves as a boundary between the first region 31 and the second thinned region 3t2 and a fourth stepped portion s4 that serves as a boundary between the third region 33 and the second thinned region 3t2.

The first thinning step may be executed under etching conditions where a semiconductor residual part having appeared over the gate insulating layer 3 is removable through the thickness of the semiconductor residual part. Specifically, the settings may be configured for etching conditions where the laminated semiconductor film composed of the semiconductor film by which the semiconductor layer 5 is formed and the contact semiconductor film by which the contact layers 7s and 7d are formed is removable through the thickness of the laminated semiconductor film. Meanwhile, the second thinning step may be executed, for example, at the same time as etching by which the contact semiconductor film is separated into the source contact layer 7s and the drain contact layer 7d. In this case, the second thinning step is executed under etching conditions where the contact semiconductor film is entirely removed and only a surface portion of the semiconductor film is removed.

Accordingly, the thickness h1 of a surface portion of the gate insulating layer 3 that is removed in the first thinning step (i.e. the height of the first stepped portion s1) may be greater than the thickness h2 of a surface portion of the gate insulating layer 3 that is removed in the second thinning step (i.e. the height of the second stepped portion s2). It should be noted that the height of the third stepped portion s3 is equal to the thickness h2, which is removed in the second thinning step. The height of the fourth stepped portion s4 is equal to the thickness h1, which is removed in the first thinning step.

<Effects>

In the active matrix substrate 100 of the present embodiment, a portion of the gate insulating layer 3 located between the semiconductor layer 5 and the gate electrode GE is kept at a predetermined thickness, while other portions of the gate insulating layer 3 (e.g. a portion of the gate insulating layer 3 that makes contact with the pixel electrode PE) are thinned. This makes it possible to, while securing desired TFT characteristics, reduce a film stress that is produced in the gate insulating layer 3.

As mentioned above, since the first mask, which is used in patterning of the source conducting film, is used in thinning (first thinning step) of the gate insulating layer 3, the gate insulating layer 3 is thinned substantially all over a region (including the pixel electrode formation region 103) in each pixel region that contributes to a display. Since a large portion of the gate insulating layer 3 is thinned in each pixel region, the film stress of the gate insulating layer 3 can be effectively reduced. Further, by further thinning the gate insulating layer 3 in the second thinning step, the film stress of the gate insulating layer 3 can be further reduced.

Since the reduction in film stress of the gate insulating layer 3 relaxes the stress on the dielectric layer 11 from the gate insulating layer 3, adhesion with the gate insulating layer 3 can be secured even when the dielectric layer 11 is thinned. Accordingly, display defects such as shadowing and flicker can be reduced by increasing the transparent auxiliary capacitance by thinning the dielectric layer 11.

Furthermore, in the present embodiment, after patterning of the semiconductor film and the contact semiconductor film, the first mask is utilized to perform patterning of the source conducting film and execute the first thinning step on the gate insulating layer 3. For this reason, even in a case where a semiconductor residual part has appeared over the gate insulating layer 3 during the patterning of the semiconductor film and the contact semiconductor film, a portion of the semiconductor residual part located in a region that is not covered with the first mask can be removed through the thickness thereof in the first thinning step. Accordingly, for example, a semiconductor residual part having appeared over the pixel electrode formation region 103 or in the gap portion 110 between the pixel electrode formation region 103 and the source bus line formation region 102 is removed in the first thinning step. This in turn makes it possible to reduce display defects and leak defects that are attributed to semiconductor residual parts.

For example, as shown in FIG. 20D, in a case where a semiconductor residual part has appeared so as to make a connection between the source bus line formation region 102 and the pixel electrode formation region 103, a portion of the semiconductor residual part located in the pixel electrode formation region 103 and a portion of the semiconductor residual part located in the gap portion 110 between the source bus line formation region 102 and the pixel electrode formation region 103 are removed in the first thinning step. As a result, only a portion 171 of the semiconductor residual part located in the source bus line formation region 102 remains without being removed. The part 171 (called "semiconductor section") of the semiconductor residual part is located between the source bus line SL and the gate insulating layer 3 and has an island-shaped pattern separated from the semiconductor layer 5. Further, the semiconductor section 171 is not in contact with the pixel electrode PE. Accordingly, even when the semiconductor section 171 is formed, no leak occurs between the pixel electrode PE and the source bus line SL.

Thus, according to the present embodiment, leak defects attributed to semiconductor residues can be reduced not only in a case where a semiconductor residual part is entirely removed but also in a case where a semiconductor residual part is partially remains below the source metal layer M2 (e.g. the source bus line SL).

Further, in the conventional manufacturing process, as will be described in detail later, etching the semiconductor film and the contact semiconductor film (laminated semiconductor film) using the same mask as the source conducting film may cause a Si product to be formed in the shape of a wall at an edge of the semiconductor layer 5 in a channel width direction, so that there is a risk that a source-drain leak may occur. On the other hand, in the present embodiment, the patterning of the laminated semiconductor film and the patterning of the source conducting film are performed separately. Further, the source conducting film is patterned so as to fully cover upper and side surfaces of the laminated semiconductor film thus patterned. This makes it possible to prevent the formation of a Si product, thus making it possible to reduce leak defects attributed to Si products.

<Method for Manufacturing Active Matrix Substrate 100>

An example of a method for manufacturing an active matrix substrate 100 according to the present embodiment is described. The following describes a single pixel region of the active matrix substrate 100.

Figure 3A:
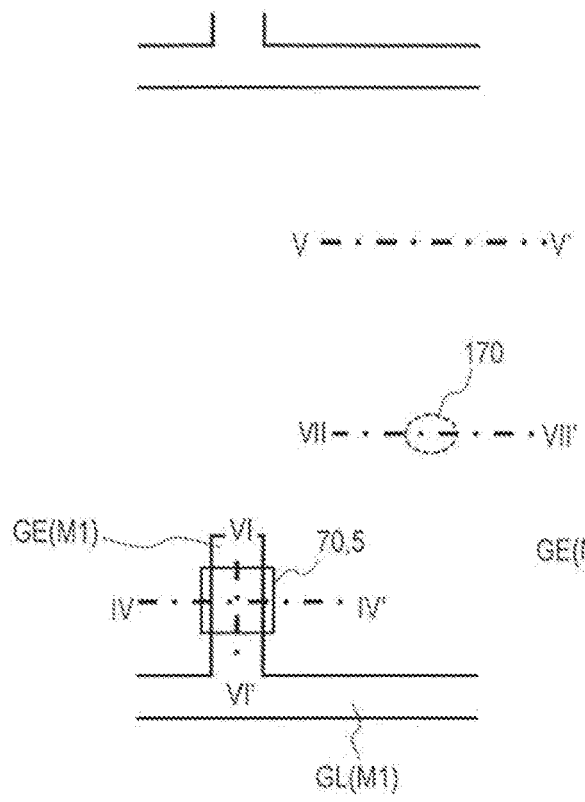
FIG. 3A is a step plan view explaining a method for manufacturing an active matrix substrate 100.
Figure 3B:
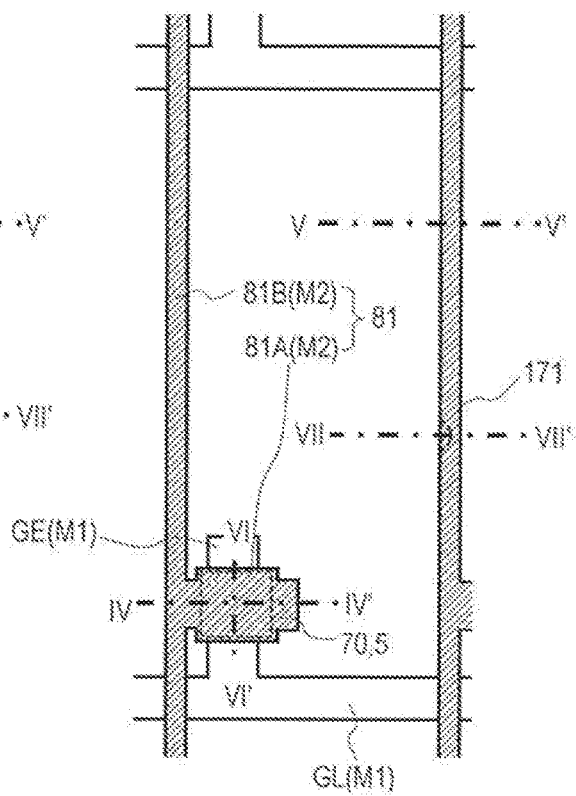
FIG. 3B is a step plan view explaining the method for manufacturing an active matrix substrate 100.
Figure 3C:
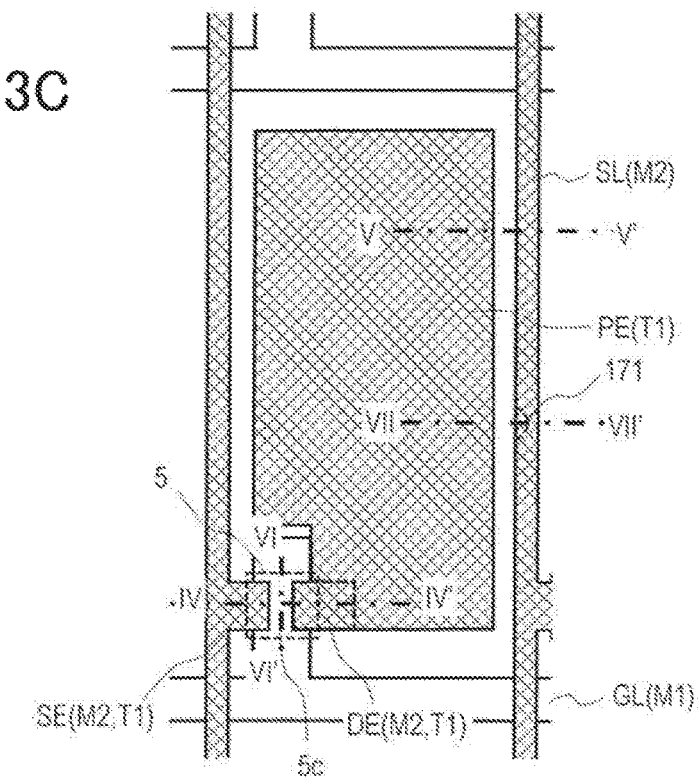
FIG. 3C is a step plan view explaining the method for manufacturing an active matrix substrate 100.

FIGS. 3A to 3C are step plan views for explaining the method for manufacturing an active matrix substrate 100. FIGS. 4A to 4G are step cross-sectional views of the TFT formation region 101 and the source bus line formation region 102, and illustrate cross-sections taken along line IV-IV' across the TFT 10 in a channel width direction in FIGS. 3A to 3C and cross-sections taken along line V-V' across the source bus line SL. FIGS. 5A to 5G illustrate cross-sections taken along line VI-VI' across the TFT 10 in a channel width direction in FIGS. 3A to 3C. FIGS. 6A to 6G are step cross-sectional views of the etching residue appearance region 104, and illustrate cross-sections taken along line VII-VII' shown in FIGS. 3A to 3C. Further, FIG. 7 schematically shows a process flow of the active matrix substrate 100.

Formation of Gate Metal Layer M1, Gate Insulating Layer 3, Semiconductor Layer 5, and Contact Conducting Layer 70 (FIGS. 3A, 4A, 5A, and 6A)

The gate conducting film (whose thickness is for example is greater than or equal to 50 nm and less than or equal to 500 nm) is formed over the substrate 1, for example, by a sputtering method. Next, patterning of the first conducting film is performed by a publicly-known photolithography step and a publicly-known etching step. According to this, the gate metal layer M1, which includes the gate electrode GE of the TFT 10 and the gate bus line GL, is formed.

A usable example of the substrate 1 is a transparent insulating substrate such as a glass substrate, a silicon substrate, a heat-resistant plastic substrate (resin substrate).

The gate conducting film is not limited to a particular material but may be made as appropriate of a film containing metal such as aluminum (Al), tungsten (W), molybdenum (Mo), tantalum (Ta), chromium (Cr), titanium (Ti), or copper (Cu), an alloy thereof, or a metal nitride thereof. Alternatively, the gate conducting film may be made of a laminated film obtained by stacking a plurality of these films. In this example, the gate conducting film is made of a laminated film obtained by stacking a Ti film (25 to 35 nm thick), an Al film (180 to 220 nm thick), and a Ti film (90 to 110 nm thick) in this order from the substrate 1.

Next, the gate insulating layer 3 (whose thickness is for example greater than or equal to 300 nm and less than or equal to 500 nm), the semiconductor film (not illustrated, whose thickness is for example greater than or equal to 100 nm and less than or equal to 250 nm), and the contact semiconductor film (not illustrated, whose thickness is for example greater than or equal to 20 nm and less than or equal to 100 nm) are formed in this order over the substrate 1 so as to cover the gate metal layer M1. These films are formed, for example, by a CVD method.

As the gate insulating layer 3, a silicon oxide ($SiO_y$) layer, a silicon nitride ($SiN_x$) layer, a silicon oxynitride ($SiO_xN_y$; x>y) layer, a silicon nitroxide ($SiN_xO_y$; x>y) layer, or the like may be used as appropriate. The gate insulating layer 3 may be a single layer or may have a laminated structure. The gate insulating layer 3 may for example be a $SiN_x$ layer whose thickness is greater than or equal to 360 nm and less than or equal to 450 nm. In this example, a $SiN_x$ layer whose thickness is 400 nm is used.

As the semiconductor film, an amorphous silicon (a-Si) film whose thickness is for example greater than or equal to 100 nm and less than or equal to 200 nm may be used, and as the contact semiconductor film, an $n^+$-type a-Si film whose thickness is for example greater than or equal to 30 nm and less than or equal to 80 nm may be used. The contact semiconductor film may contain an impurity (in this example, an n-type impurity such as phosphorus) in a higher concentration than the semiconductor film.

Figure 4A:
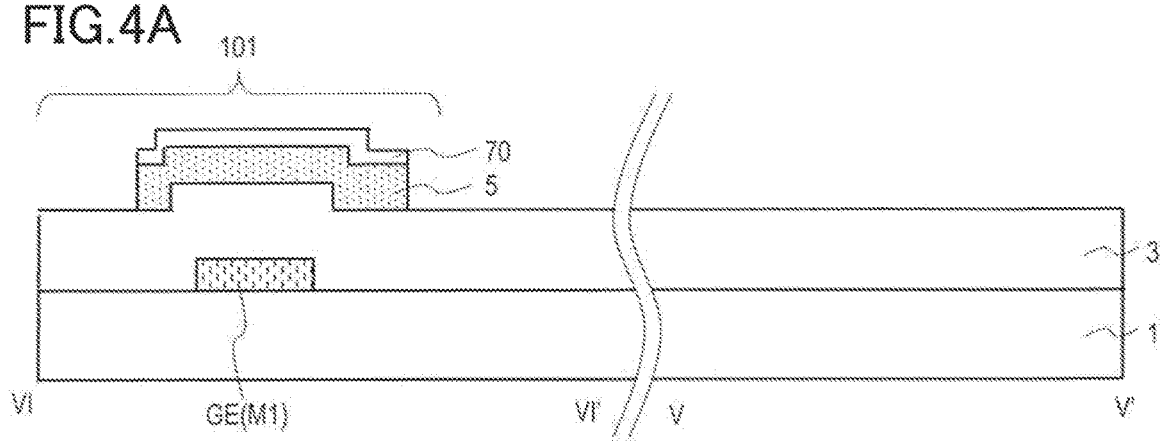
FIG. 4A is a step cross-sectional view taken along lines IV-IV' and V-V' for explaining the method for manufacturing an active matrix substrate 100.
Figure 5A:
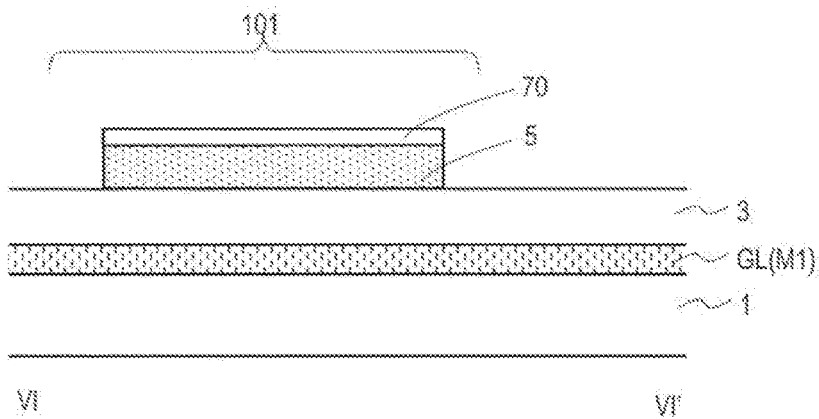
FIG. 5A is a step cross-sectional view taken along line VI-VI' for explaining the method for manufacturing an active matrix substrate 100.

After this, a resist mask (not illustrated) is formed over the contact semiconductor film by a publicly-known photolithography step, and etching of the semiconductor film and the contact semiconductor film is performed. In this way, as shown in FIGS. 3A, 4A, and 5A, the semiconductor layer 5 and a contact semiconductor layer 70 of the active matrix substrate 100 are obtained. The semiconductor layer 5 and the contact semiconductor layer 70 may have island-shaped patterns in each pixel region.

Figure 6A:
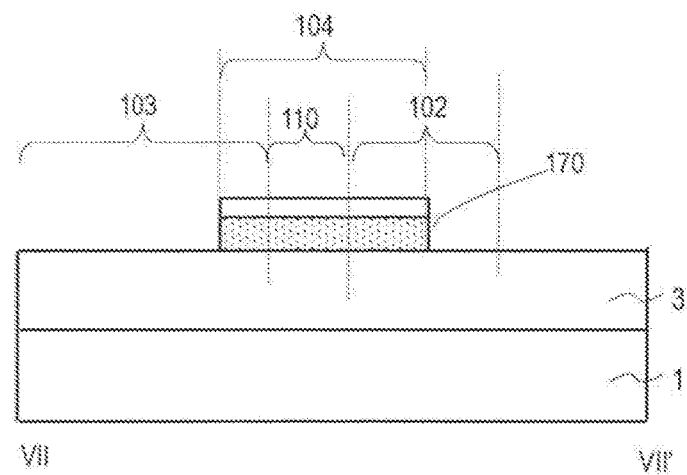
FIG. 6A is a step cross-sectional view of the etching residue appearance region 104 as taken along line VII-VII' for explaining the method for manufacturing an active matrix substrate 100.
Figure 7:
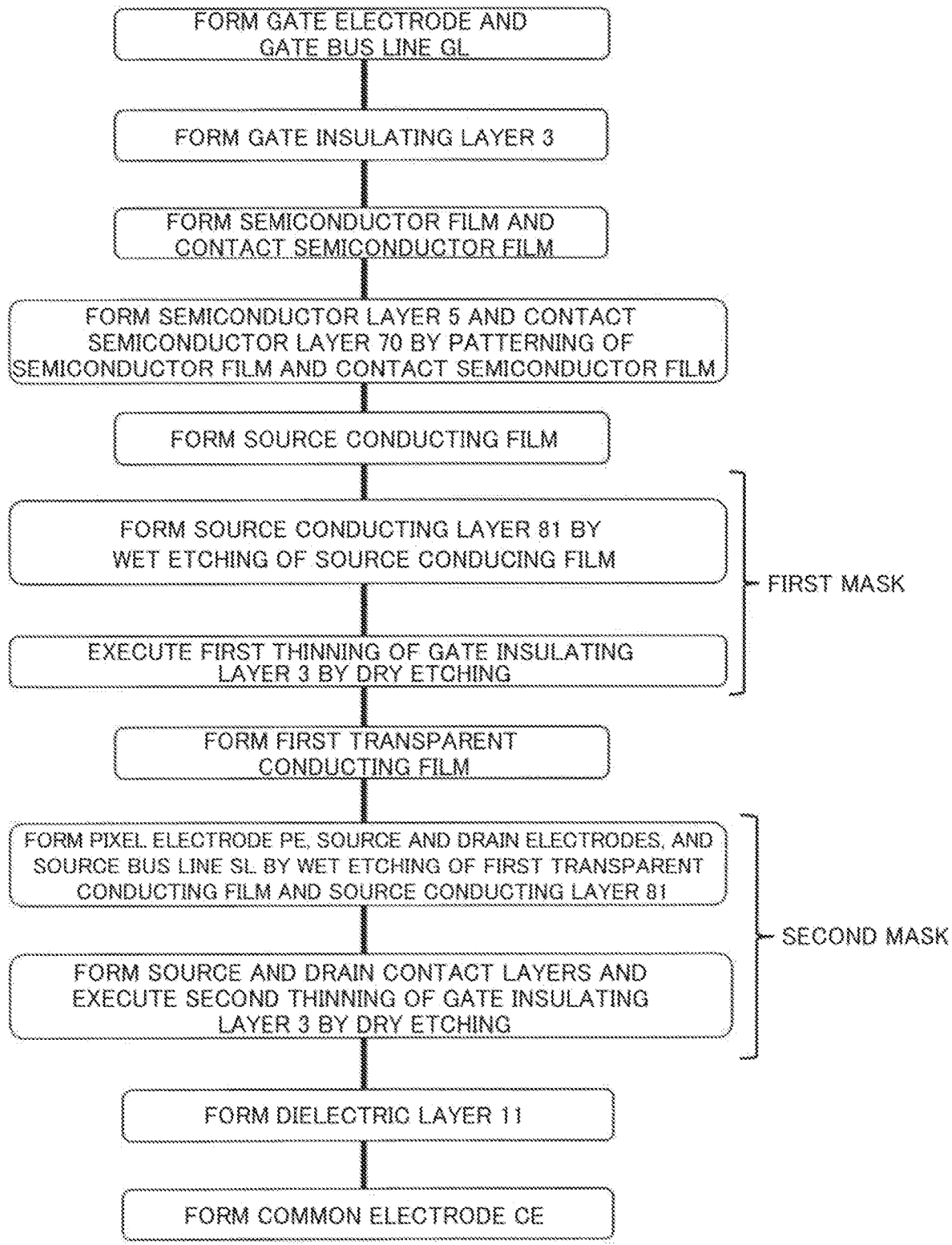
FIG. 7 is a diagram schematically showing a process flow of the active matrix substrate 100.

In this etching step, foreign matter (dust) having adhered to the contact semiconductor film acts as a mask (masking effect), whereby as illustrated in FIGS. 3A and 6A, an etching residue (semiconductor residual part) 170 may appear on the semiconductor film and the contact semiconductor film. In this example, the semiconductor residual part 170 is present so as to make a connection between the source bus line formation region 102 and the pixel electrode formation region 103.

Formation of Source Metal Layer M2 (FIGS. 4B, 4C, 5B, 5C, 6B, and 6C)

Figure 4B:
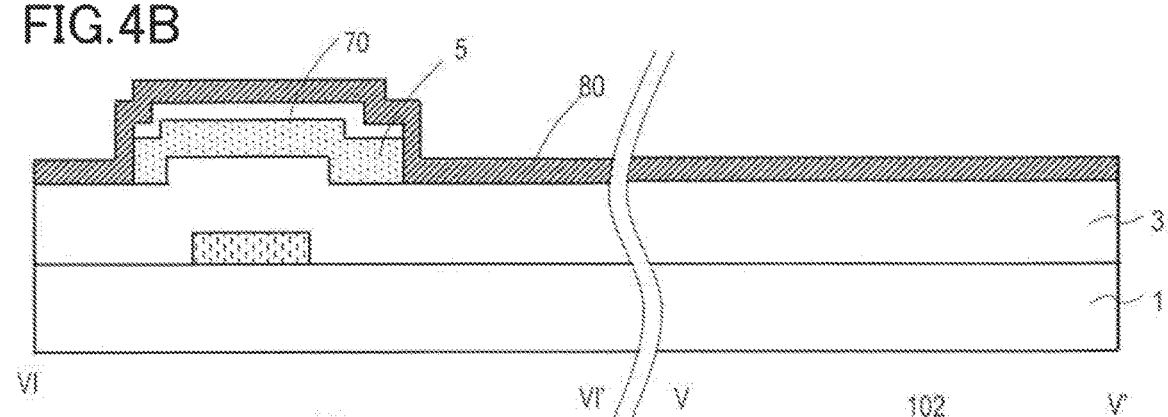
FIG. 4B is a step cross-sectional view taken along lines IV-IV' and V-V' for explaining the method for manufacturing an active matrix substrate 100.
Figure 5B:
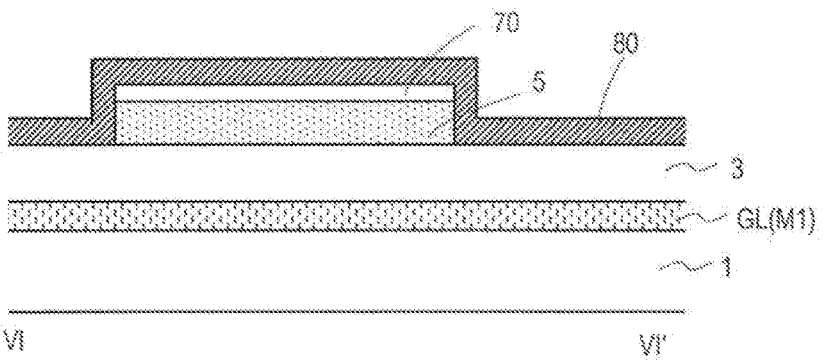
FIG. 5B is a step cross-sectional view taken along line VI-VI' for explaining the method for manufacturing an active matrix substrate 100.
Figure 6B:
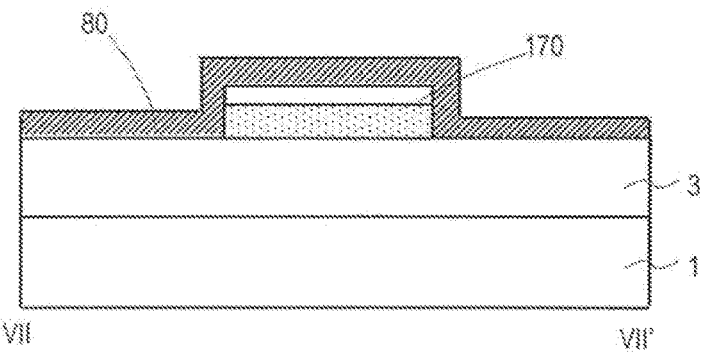
FIG. 6B is a step cross-sectional view of the etching residue appearance region 104 as taken along line VII-VII' for explaining the method for manufacturing an active matrix substrate 100.

Then, as shown in FIGS. 4B, 5B, and 6B, a source conducting film (whose thickness is for example greater than or equal to 50 nm and less than or equal to 500 nm) 80 is formed so as to cover the gate insulating layer 3, the semiconductor layer 5, and the contact semiconductor layer 70. The source conducting film 80 may be formed, for example, by a sputtering method.

The source conducting film 80 is not limited to a particular material but may be made as appropriate of a film containing metal such as aluminum (Al), tungsten (W), molybdenum (Mo), tantalum (Ta), copper (Cu) chromium (Cr), or titanium (Ti), an alloy thereof, or a metal nitride thereof. In this example, the source conducting film 80 is made of a MoN film whose thickness is for example greater than or equal to 180 nm and less than or equal to 220 nm.

Figure 4C:
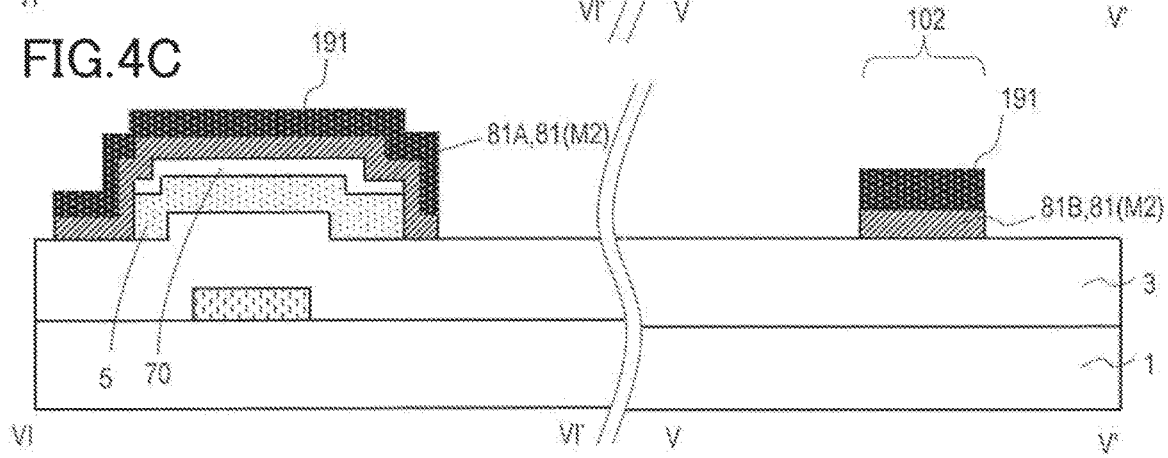
FIG. 4C is a step cross-sectional view taken along lines IV-IV' and V-V' for explaining the method for manufacturing an active matrix substrate 100.
Figure 5C:
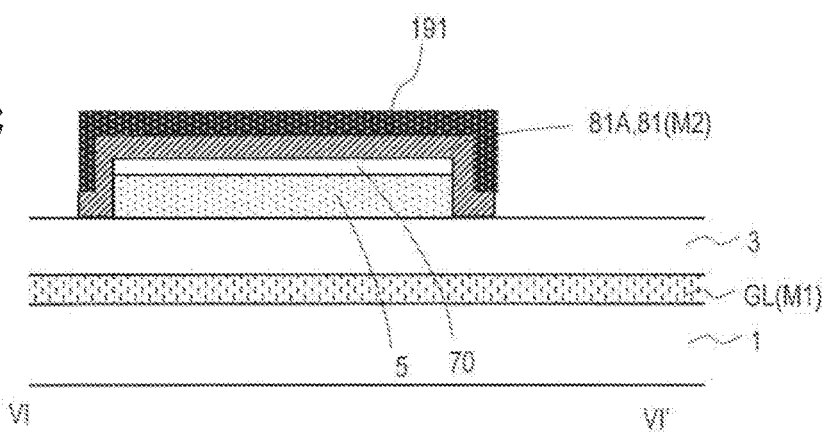
FIG. 5C is a step cross-sectional view taken along line VI-VI' for explaining the method for manufacturing an active matrix substrate 100.

Next, as shown in FIGS. 4C and 5C, patterning of the source conducting film 80 is performed, so that a source conducting layer 81 is formed. In this example, a source resist mask (first mask) 191 is formed over the source conducting film 81 by a publicly-known photolithography step using a first photomask (not illustrated). Next, patterning of the source conducting film 80 is performed using the first mask 191. In this example, patterning of the source conducting film 80 is performed by wet etching.

The source conducting layer 81 includes a first source section 81A disposed in the TFT formation region 101 and a second source section 81B disposed in the source bus line formation region 102. The first source section 81A and the second source section 81B are connected to each other (i.e. formed integrally with each other). In this example, the second source section 81B is set to be greater in width than the source bus line SL.

The first source section 81A is formed so as to fully cover upper and side surfaces of a laminated body composed of the semiconductor layer 5 and the contact semiconductor layer 70 and is in contact with a portion of the gate insulating layer 3 located near a side surface of the semiconductor layer 5.

Figure 6C:
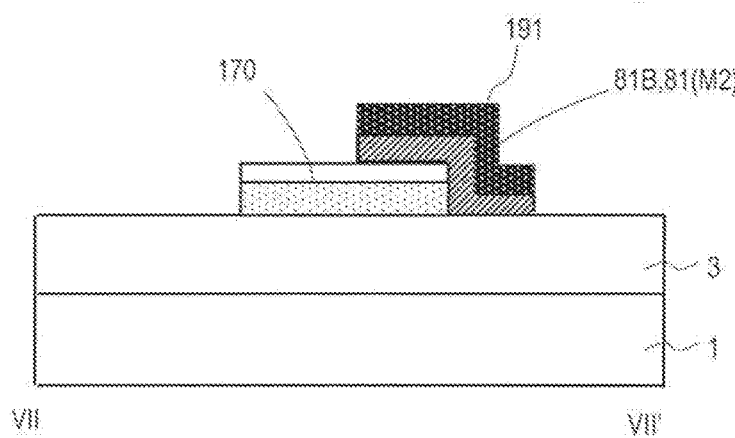
FIG. 6C is a step cross-sectional view of the etching residue appearance region 104 as taken along line VII-VII' for explaining the method for manufacturing an active matrix substrate 100.

In a case where a part of the semiconductor residual part 170 is present in the source bus line formation region 102, the second source section 81B is formed so as to cover the part of the semiconductor residual part 170 as shown FIG. 6C.

First Thinning Step (FIGS. 3B, 4D, 5D, and 6D)

Figure 4D:
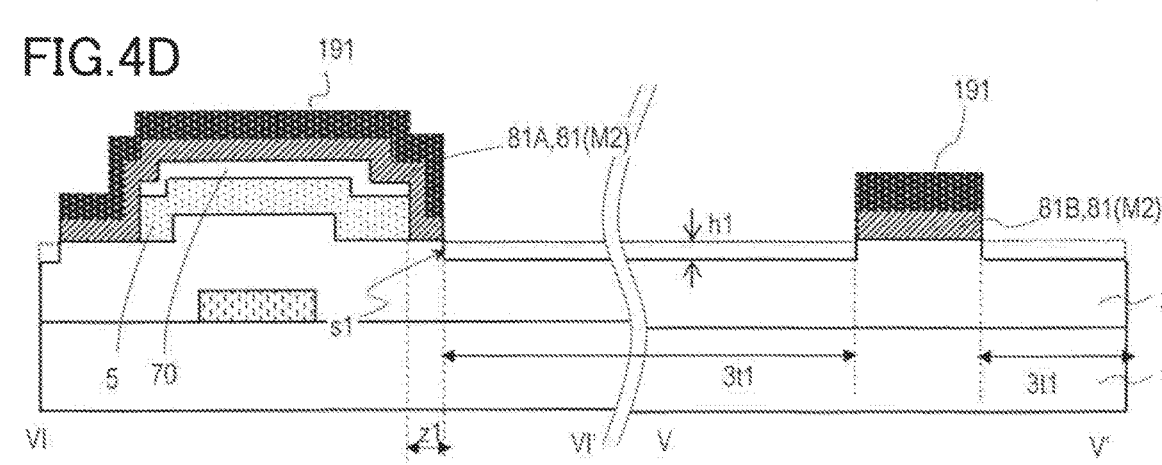
FIG. 4D is a step cross-sectional view taken along lines IV-IV' and V-V' for explaining the method for manufacturing an active matrix substrate 100.
Figure 5D:
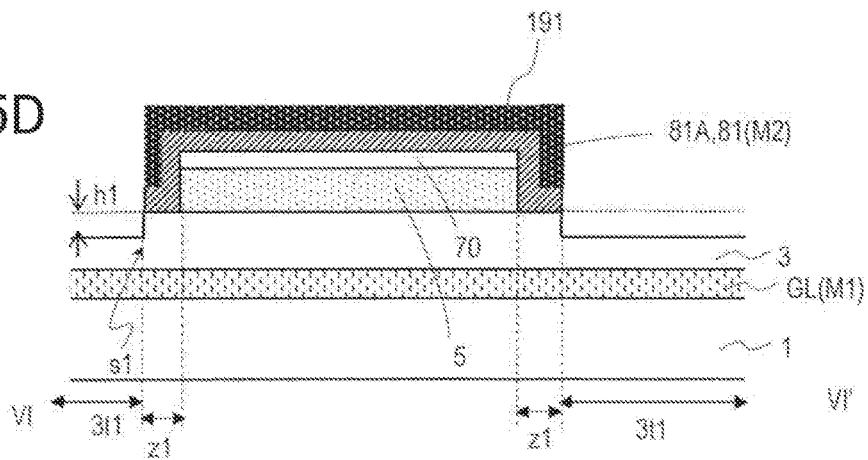
FIG. 5D is a step cross-sectional view taken along line VI-VI' for explaining the method for manufacturing an active matrix substrate 100.
Figure 6D:
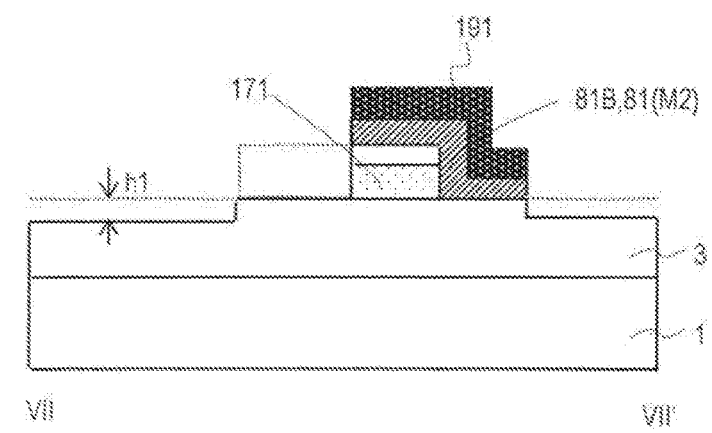
FIG. 6D is a step cross-sectional view of the etching residue appearance region 104 as taken along line VII-VII' for explaining the method for manufacturing an active matrix substrate 100.

Then, as shown in FIGS. 4D, 5D, and 6D, the first mask 191 is utilized as-is to perform dry etching. According to this, a surface portion of a region of the gate insulating layer 3 exposed from the source conducting layer 81 is removed, so that the gate insulating layer 3 is partially thinned. In this step, a portion of the gate insulating layer 3 exposed from the source conducting layer 81 and thinned becomes the first thinned region 3t1. The first thinned region 3t1 may be formed substantially all over each pixel region excluding the source bus line formation region 102 and the TFT formation region 101.

In the first thinning step, as shown in FIGS. 3B and 6D, a portion of the semiconductor residual part 170 exposed from the second source section 81B too is removed through the thickness thereof. A portion of the semiconductor residual part 170 covered with the second source section 81B remains as the semiconductor section 171 below the second source section 81B. Although not illustrated, in the presence of a semiconductor residual part in the pixel electrode formation region 103 of the gate insulating layer 3, the semiconductor residual part is entirely removed in this step. After this, the first mask 191 is removed. FIG. 3B is a plan view after removal of the first mask 191.

The first thinning step causes the upper surface of the gate insulating layer 3 to have a stepped portion (first stepped portion) s1. The first stepped portion s1 is formed to be flush with a side surface of the source conducting layer 81. A part of the first stepped portion s1 is flush with a side surface of the drain electrode DE.

The height h1 of the first stepped portion s1 (i.e. the thickness of the portion removed in the first thinning step) is for example greater than or equal to 100 nm and less than or equal to 150 nm. In this step, etching conditions need only be set, for example, to be such conditions that the semiconductor residual part 170 is removed through the thickness thereof, and the height h1 is not confined to the aforementioned range.

An end of the first source section 81A is located closer to the outside than an end of the semiconductor layer 5. In this example, the distance z1 between an end of the semiconductor layer 5 that faces the drain and the end of the first source section 81A in a plane of the substrate 1 is for example greater than or equal to 0.5 μm and less than or equal to 1.2 μm.

In the foregoing, the first thinning step is executed without removal of the first mask 191 after the etching of the source conducting film. Alternatively, the first mask 191 may be removed after the etching of the source conducting film, and then the first thinning step may be executed with the source conducting layer 81 as a mask.

Formation of First Transparent Conducting Layer T1 (FIGS. 4E, 4F, 5E, 5F, 6E, and 6F)

Figure 5E:
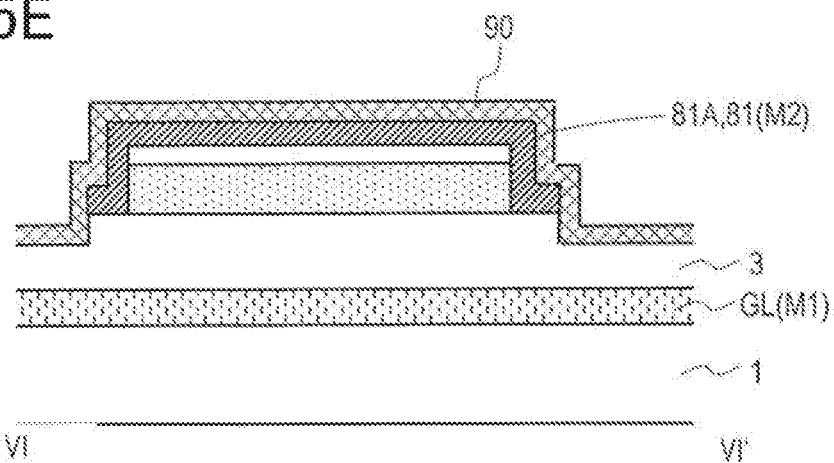
FIG. 5E is a step cross-sectional view taken along line VI-VI' for explaining the method for manufacturing an active matrix substrate 100.
Figure 6E:
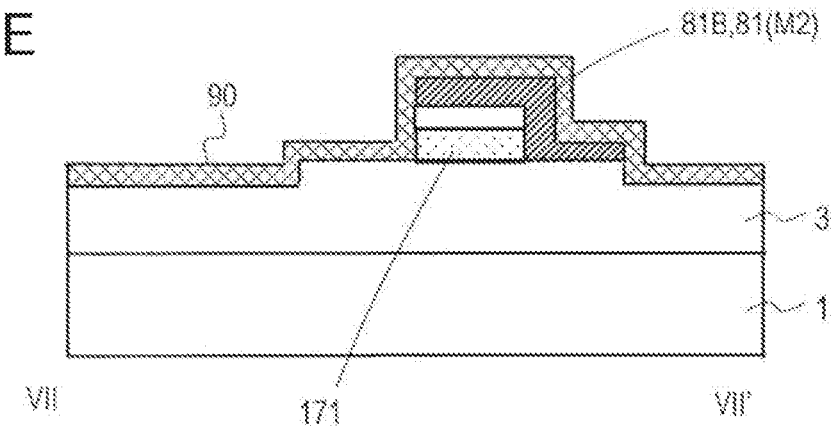
FIG. 6E is a step cross-sectional view of the etching residue appearance region 104 as taken along line VII-VII' for explaining the method for manufacturing an active matrix substrate 100.

Next, as shown in FIGS. 4E, 5E, and 6E, a first transparent conducting film (20 to 300 nm thick) 90 is formed, for example, by a sputtering method so as to cover the source conducting layer 81.

A usable example of the first transparent conducting film 90 is an ITO (indium tin oxide) film, an IZO film (indium zinc oxide), a ZnO film (zinc oxide film), or the like. In this example, an IZO film (50 to 80 nm thick) is formed as the transparent conducting film by a sputtering method.

Figure 5F:
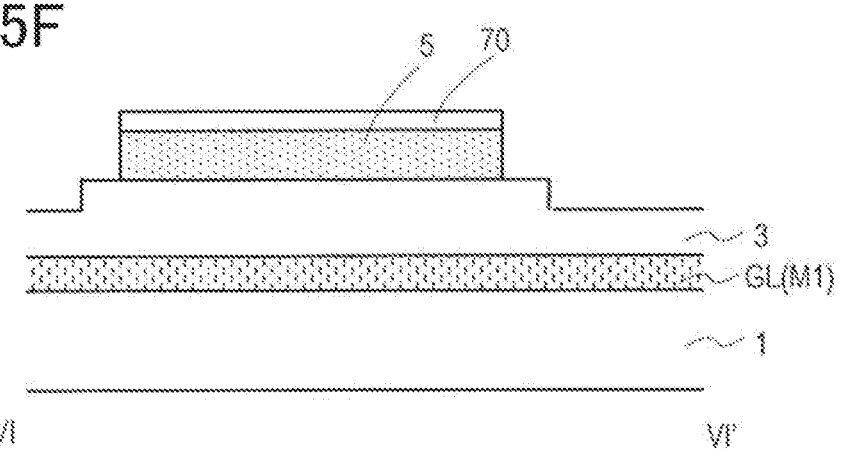
FIG. 5F is a step cross-sectional view taken along line VI-VI' for explaining the method for manufacturing an active matrix substrate 100.
Figure 6F:
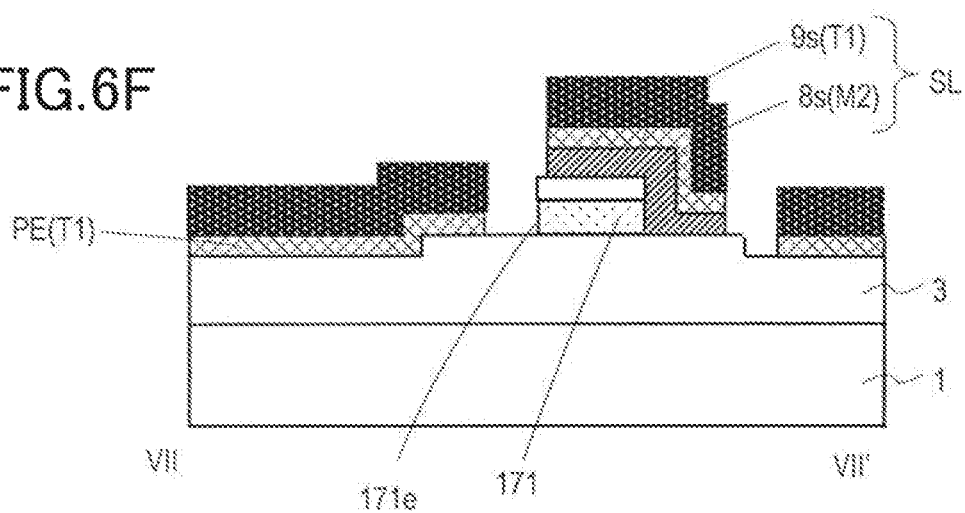
FIG. 6F is a step cross-sectional view of the etching residue appearance region 104 as taken along line VII-VII' for explaining the method for manufacturing an active matrix substrate 100.

Then, as shown in FIGS. 4F, 5F, and 6F, a pixel electrode resist mask (second mask) 192 is formed over the first transparent conducting film 90 by a publicly-known photolithography step using a second photomask (not illustrated). After this, patterning of the first transparent conducting film 90 and the source conducting layer 81 is performed by wet etching using the second mask 192. According to this, the source metal layer M2, which includes the source bus line SL and the lower layers 8s and 8d of the source electrode SE and the drain electrode DE, is formed from the source conducting layer 81, and the first transparent conducting layer T1, which includes the source bus line SL, the pixel electrode PE, and the upper layers 9s and 9d of the source electrode SE and the drain electrode DE, is formed from the first transparent conducting film 90.

More specifically, in the TFT formation region 101, the source electrode SE, which has the upper layer 9s and the lower layer 8s, and the drain electrode DE, which has the upper layer 9d and the lower layer 8d, are formed from the first transparent conducting film 90 and the source conducting layer 81. In the pixel electrode formation region 103 the pixel electrode PE is formed from the first transparent conducting film 90. The pixel electrode PE is connected to the upper layer 9d of the drain electrode DE. Further, in the source bus line formation region 102, a peripheral edge portion of the second source section 81B too is etched when the first transparent conducting film 90 is patterned. As a result, the source bus line SL, which has the upper layer (upper line) 9s and the lower layer (lower line) 8s, is formed. In this example, the source bus line SL is smaller in width than the second source section 81B.

Further, in the etching residue appearance region 104, as shown in FIG. 6F, an edge 171e of the semiconductor section 171 is exposed from the source bus line SL, depending on a configuration relationship between the second mask 192 and the second source section 81B.

Contact Layer Formation and Second Thinning Step (FIGS. 3C, 4G, 5G, and 6G)

Figure 5G:
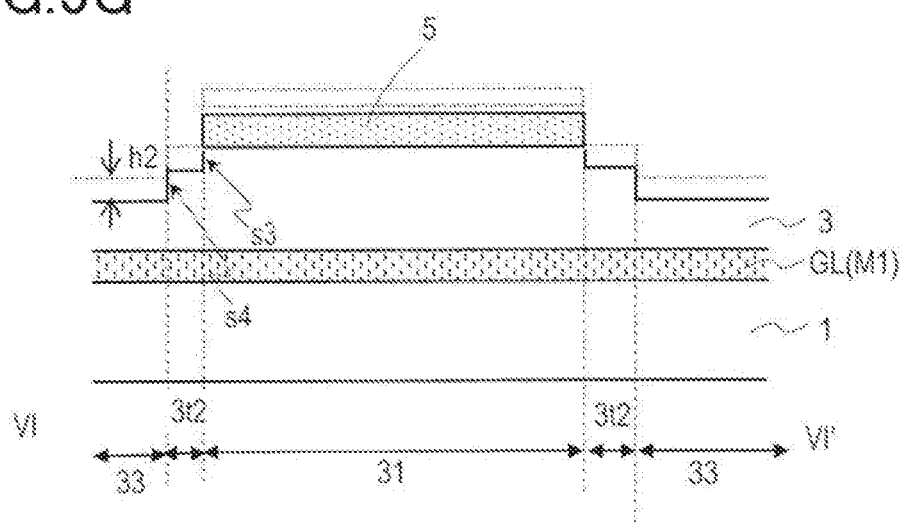
FIG. 5G is a step cross-sectional view taken along line VI-VI' for explaining the method for manufacturing an active matrix substrate 100.

Then, the second mask 192 is utilized as-is to perform dry etching. According to this, as shown in FIGS. 4G and 5G, a portion of the contact semiconductor layer 70 that is not covered with the source electrode SE or the drain electrode DE is removed, so that the semiconductor layer 5 is exposed. According to this, the source contact layer 7s and the drain contact layer 7d are formed from the contact semiconductor layer 70. The source contact layer 7s and the drain contact layer 7d are electrically separated from each other. Further, a surface of the exposed portion of the semiconductor layer 5 too may be etched and thinned. Accordingly, a portion (including the channel region 5c) of the semiconductor layer 5 that does no overlap the source electrode SE or the drain electrode DE when seen from the direction of the normal to the substrate 1 is thinned.

Furthermore, in this dry etching step, a surface portion of a region of the gate insulating layer 3 that is not covered with the first transparent conducting layer T1, the source metal layer M2, or the semiconductor layer 5 too may be etched and further thinned (second thinning step). A portion of the first thinned region 3t1 that was not thinned in this step becomes the second region 32, and the portion further thinned in this step becomes the third region 33, which is thinner than the second region 32. Further, depending on the width of the source bus line SL as defined by the second mask 192, a region (second thinned region) 3t2 thinned only in the second thinning step without being etched in the first thinning step may appear near the peripheral edge of the source bus line SL.

Figure 6G:
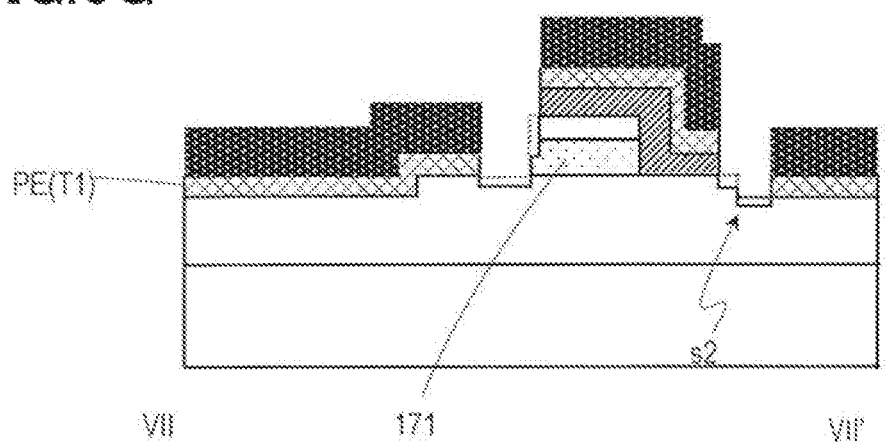
FIG. 6G is a step cross-sectional view of the etching residue appearance region 104 as taken along line VII-VII' for explaining the method for manufacturing an active matrix substrate 100.

In the etching residue appearance region 104, as shown in FIG. 6G, the portion (edge) 171e of the semiconductor section 171 exposed from the source bus line SL too is thinned. In this example, an upper part (i.e. a portion formed from the contact semiconductor film) of the edge 171e of the semiconductor section 171 is removed. A lower part (i.e. a portion formed from the semiconductor film) of the edge 171e of the semiconductor section 171 is thinned to be exposed from the source bus line SL.

After dry etching, the second mask 192 is removed. FIG. 3C is a plan view after removal of the second mask 192.

The second thinning step causes the upper surface of the gate insulating layer 3 to have a step that is flush with side surfaces of electrodes and wires in the first transparent conducting layer T1. In this example, in the first thinning region 3t1, the second stepped portion s2 is formed to be flush with the side surface of the pixel electrode PE. Further, between a portion of the first region 31 that makes contact with the source bus line SL and the second thinned region 3t2, the third stepped portion s3 is formed to be flush with a side surface of the source bus line SL. Furthermore, the fourth stepped portion s4 is formed between the second thinned region 3t2 and the third region 33. The fourth stepped portion s4 is flush with a side surface of the second source section 81B to be etched.

The height h2 of the second stepped portion s2 and the height of the third stepped portion s3 are equivalent to the thickness of the surface portion removed by the second thinning step and, for example, are greater than or equal to 20 nm and less than or equal to 40 nm. The height of the fourth stepped portion s4 is equivalent to the thickness (h1) of the surface portion removed by the first thinning step.

In the foregoing, the second thinning step is executed without removal of the second mask 192 after the etching of the first transparent conducting film and the source conducting film. Alternatively, the second mask 192 may be removed after the etching of the first transparent conducting film and the source conducting film, and then the second thinning step may be executed with the first transparent conducting layer T1 and the source metal layer M2 (the first transparent conducting film thus etched and the source conducting film thus etched) as masks.

Formation of Dielectric Layer 11

The dielectric layer 11 is formed all over the substrate 1 so as to cover the TFT 10 and the first transparent conducting layer T1. Next, the second transparent conducting film (not illustrated) is formed over the dielectric layer 11 and patterned, whereby the second transparent conducting layer T2, which includes the common electrode CE, is formed. In this way, the active matrix substrate 100 is manufactured (see FIGS. 2A to 2D).

As the dielectric layer 11, for example, an inorganic insulating layer such as a silicon oxide ($SiO_x$) film, a silicon nitride ($SiN_x$) film, a silicon oxynitride ($SiO_xN_y$; x>y) film, a silicon nitroxide ($SiN_xO_y$; x>y) film, or the like may be formed. The inorganic insulating layer is formed, for example, by a CVD method.

As the dielectric layer 11, a laminated film including a lower dielectric layer 11A having a compressive stress and an upper dielectric layer 11B, disposed over the lower dielectric layer 11A, that has a tensile stress may be formed by a CVD method. In this example, the lower dielectric layer 11A used is a nitride silicon ($SiN_x$) layer whose thickness is 250 nm, and the upper dielectric layer 11B used is a $SiN_x$ layer whose thickness is 350 nm. A suitable structure of the dielectric layer 11 will be described later.

The second transparent conducting film may be the same in material and thickness as the first transparent conducting film. In this example, an IZO film (whose thickness is greater than or equal to 110 nm and less than or equal to 140 nm) is formed by a sputtering method.

In the foregoing method, the first mask 191, which is used in the patterning of the source conducting film, is utilized to perform the first thinning step of the gate insulating layer 3 and the removal of the semiconductor residual part 170. Further, the second mask 192, which is used in the patterning of the first transparent conducting film, is utilized to perform the second thinning step of the gate insulating layer 3. The foregoing method makes it possible to, while checking an increase in the number of photomasks that are used, reduce defects attributed to semiconductor residual parts and thin the gate insulating layer 3 over a wider area.

(Configuration of and Method for Manufacturing Active Matrix Substrate 900 of Comparative Example)

For comparison with the active matrix substrate 100, a configuration of and a method for manufacturing an active matrix substrate of a comparative example are described here. The following describes a single pixel region.

Figure 11:
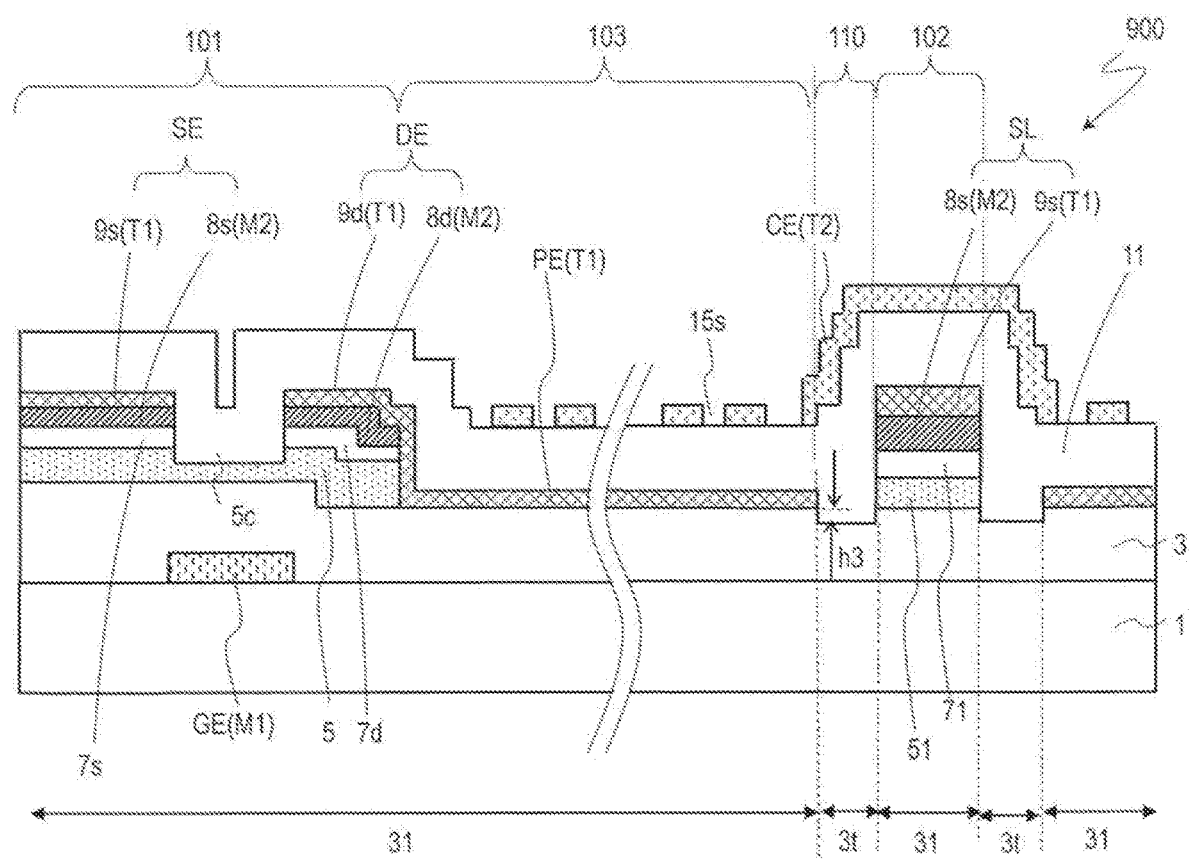
FIG. 11 is a cross-sectional view showing a TFT formation region 101 and a source bus line formation region 102 in an active matrix substrate 900 of a comparative example.

FIG. 11 is a cross-sectional view showing a TFT formation region 101 and a source bus line formation region 102 in an active matrix substrate 900 of a comparative example.

In the comparative example, a source resist mask (first mask) for patterning the source conducting film is used to perform patterning of the semiconductor film and the contact semiconductor film. For this reason, a side surface of the semiconductor layer 5 that faces the drain is flush with a side surface of the drain electrode DE. Further, the semiconductor layer 5 and the source contact layer 7s are extended below the source bus line SL. An extension portion (first source semiconductor section) 51 of the semiconductor layer 5 and an extension portion (second source semiconductor section) 71 of the source contact layer 7s extend along the source bus line SL.

Furthermore, in the comparative example, a pixel electrode resist mask (second mask) for patterning the first transparent conducting film is used to perform source-drain separation and thinning of the gate insulating layer 3. This is the only one step of thinning the gate insulating layer 3. Accordingly, a thinned region 3t is formed only in a portion of the gate insulating layer 3 that does not overlap the source metal layer M2, the pixel electrode PE (first transparent conducting layer T1), or the semiconductor layer 5. That is, the pixel electrode PE, the source bus line SL, and the semiconductor layer 5 are each disposed over the first region 31 of the gate insulating layer 3. The thinned region 3t is formed, for example, in the gap portion 110.

A method for manufacturing an active matrix substrate 900 of the comparative example is described below with reference to the drawings.

FIGS. 12A to 12D are step cross-sectional views taken across the TFT 10 in a channel length direction in the TFT formation region 101 and step cross-sectional views taken across the source bus line SL in the source bus line formation region 102. FIGS. 13A to 13D are cross-sectional views taken across the TFT 10 in a channel length direction in the TFT formation region 101. FIGS. 14A to 14D are step cross-sectional views taken across the source bus line SL in the etching residue appearance region 104. Further, FIG. 15 schematically shows a process flow of the active matrix substrate 900. In these drawings, constituent elements which are similar to those of the active matrix substrate 100 are given the same reference signs. Further, points of difference from the method for manufacturing an active matrix substrate 100 are described, and a description of steps which are similar to those of the present embodiment is omitted as appropriate.

Figure 12A:
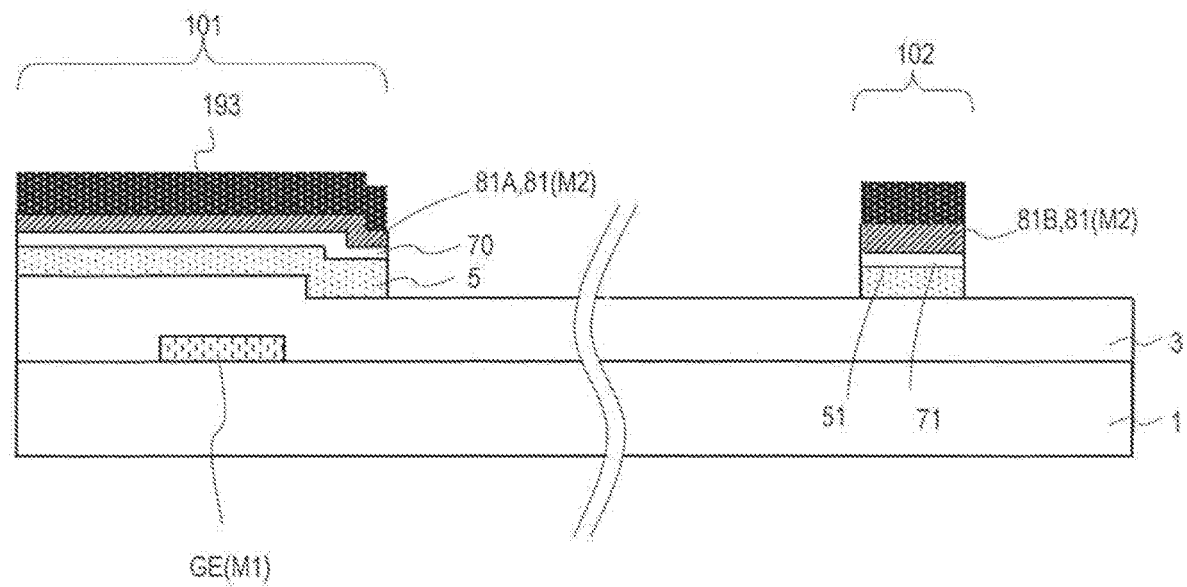
FIG. 12A is a step cross-sectional view of the TFT formation region 101 and the source bus line formation region 102 for explaining a method for manufacturing an active matrix substrate 900 of the comparative example.
Figure 13A:
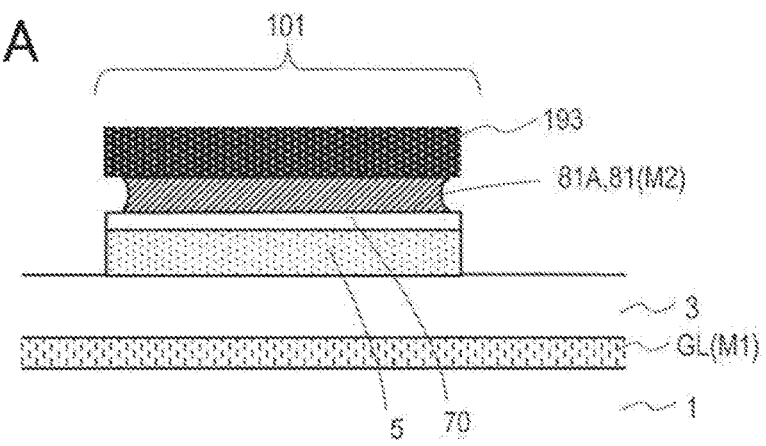
FIG. 13A is a step cross-sectional view taken across a TFT 10 in a channel width direction for explaining the method for manufacturing an active matrix substrate 900 of the comparative example.
Figure 14A:
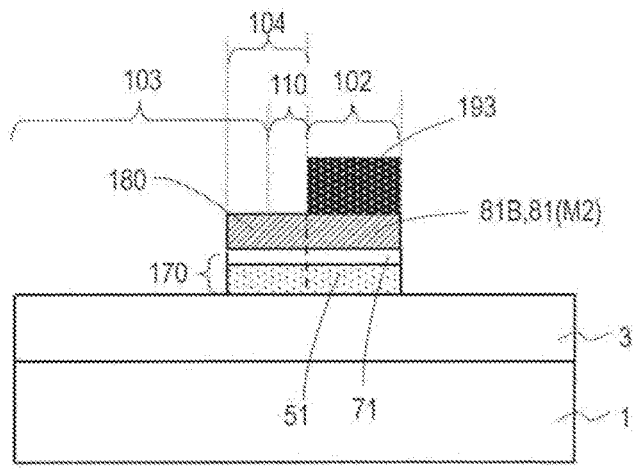
FIG. 14A is a step cross-sectional view of the etching residue appearance region 104 for explaining the method for manufacturing an active matrix substrate 900 of the comparative example.
Figure 15:
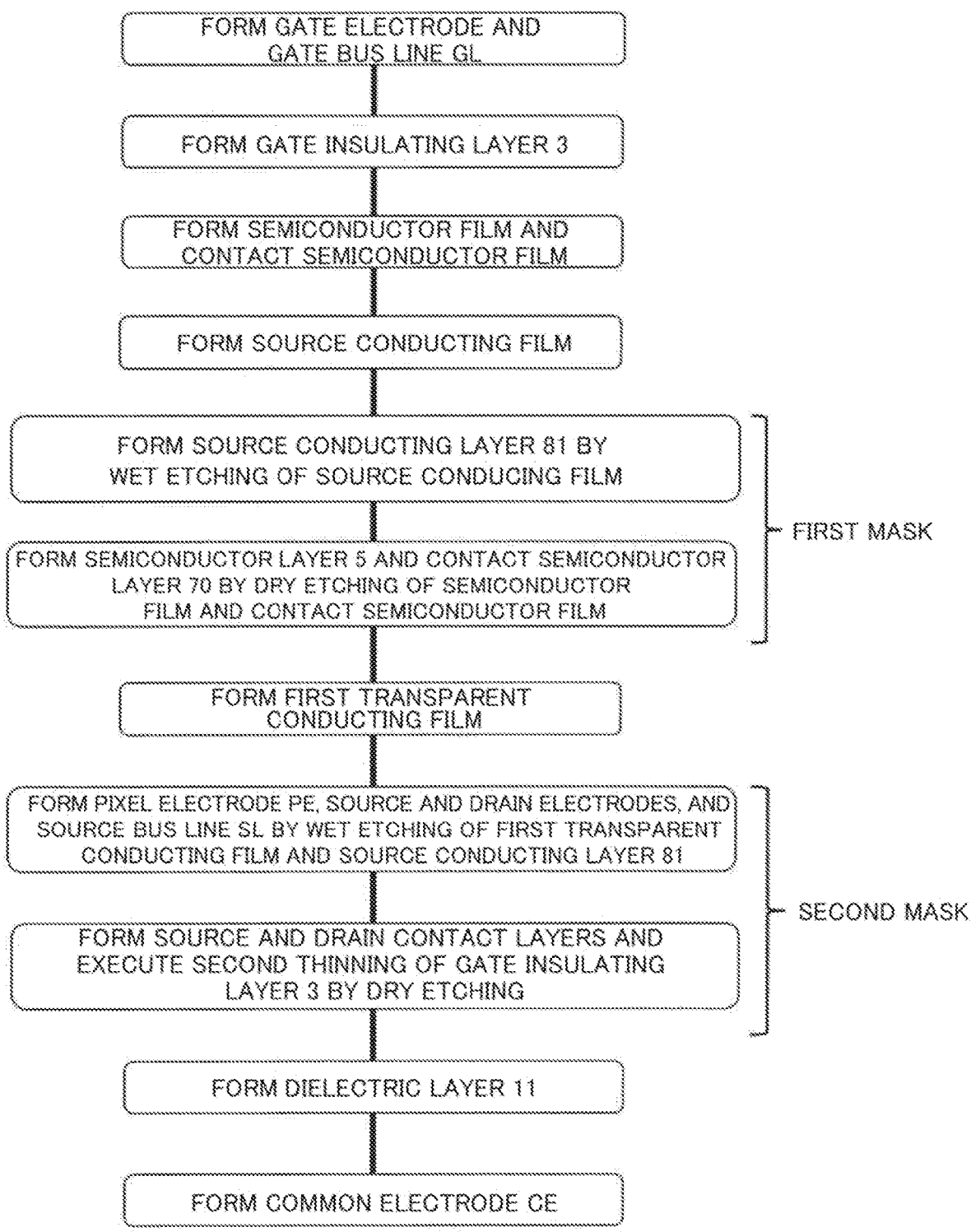
FIG. 15 schematically shows a process flow of the active matrix substrate 900 of the comparative example.

First, as shown in FIGS. 12A, 13A, and 14A, the semiconductor film, the contact semiconductor film, and the source conducting film are formed in this order over the gate insulating layer 3. Next, a source resist mask (first mask) 193 provided over the source conducting film is formed, and patterning of these films is performed. According to this, the semiconductor film and the contact semiconductor film (laminated semiconductor film) are patterned into substantially the same planar shape as the source conducting film.

In the TFT formation region 101, the semiconductor layer 5, the contact semiconductor layer 70, and the first source section 81A are formed from the semiconductor film, the contact semiconductor film, and the source conducting film, respectively. In the source bus line formation region 102, the first source semiconductor section 51, the second source semiconductor section 71, and the second source section 81B are formed from the semiconductor film, the contact semiconductor film, and the source conducting film, respectively.

In this step, the source resist mask (first mask) 193 is utilized to perform etching (dry etching) of the contact semiconductor film and the semiconductor film after etching of (wet etching) of the source conducting film. For this reason, the source conducting film is overetched, so that as illustrated in FIG. 13A, a side surface of the source conducting layer 81 is located closer to the inside than side surfaces of the semiconductor layer 5 and the contact semiconductor layer 70. This causes a ridge of the contact semiconductor layer 70 to be exposed from the source conducting layer 81. At this point in time, a resist residue may appear due to the occurrence of a resist scorch (i.e. a deterioration such as a deformation of the resist mask by heat) at an edge of the first mask 193. The resist residue is not completely removed even with a resist remover, so that an exposed surface (i.e. a surface near the ridge) of the contact semiconductor layer 70 may be modified due to the resist residue to form a Si product 151 (FIG. 13B).

Further, in this etching step, the masking effect of foreign matter (dust) having adhered to the source conducting film may cause a part of the source conducting film and a part of the laminated semiconductor film to remain as shown in FIG. 14A without being etched. An etching residue 180 of the source conducting film is called "source residual part", and an etching residue 170 of the laminated semiconductor film is called "semiconductor residual part". In this example, the source residual part 180 and the semiconductor residual part 170 extend from the gap portion 110 to the pixel electrode formation region 103.

Figure 12B:
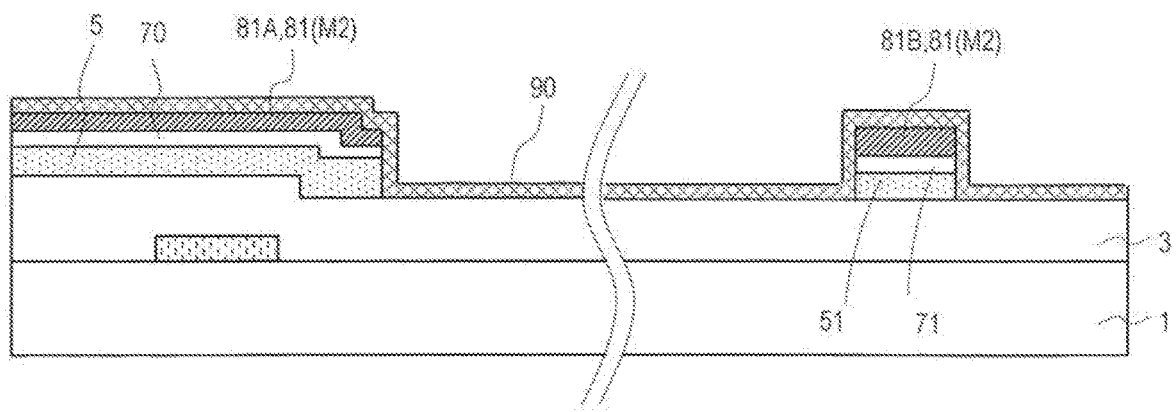
FIG. 12B is a step cross-sectional view of the TFT formation region 101 and the source bus line formation region 102 for explaining the method for manufacturing an active matrix substrate 900 of the comparative example.
Figure 13B:
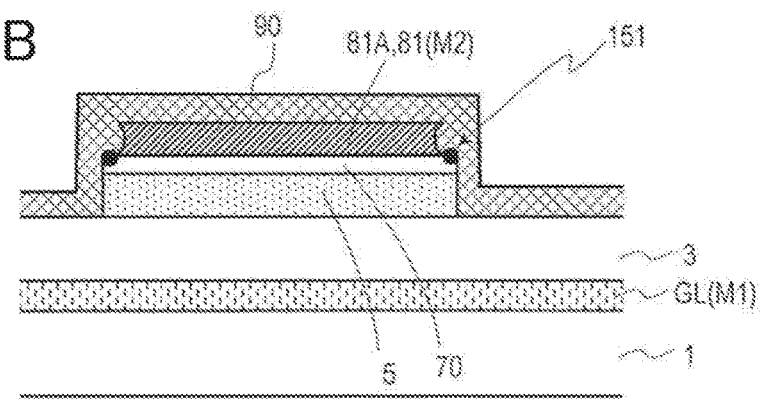
FIG. 13B is a step cross-sectional view taken across the TFT 10 in a channel width direction for explaining the method for manufacturing an active matrix substrate 900 of the comparative example.
Figure 14B:
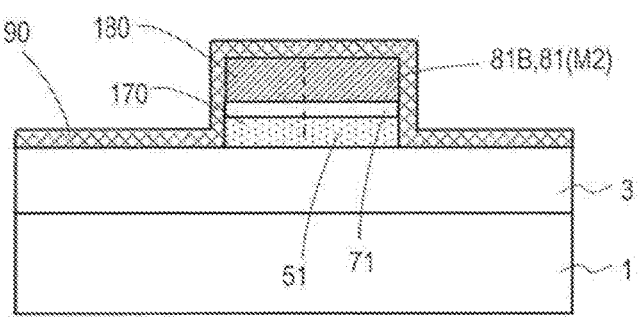
FIG. 14B is a step cross-sectional view of the etching residue appearance region 104 for explaining the method for manufacturing an active matrix substrate 900 of the comparative example.

After the first mask (source resist mask) 193 has been removed, the first transparent conducting film 90 is formed so as to cover the first source section 81A and the second source section 81B as shown in FIGS. 12B, 13B, and 14B.

After this, a pixel electrode resist mask (second mask) 194 provided over the first transparent conducting film 90 is used to perform patterning of the first transparent conducting film 90 and the source conducting layer 81 by wet etching.

Figure 12C:
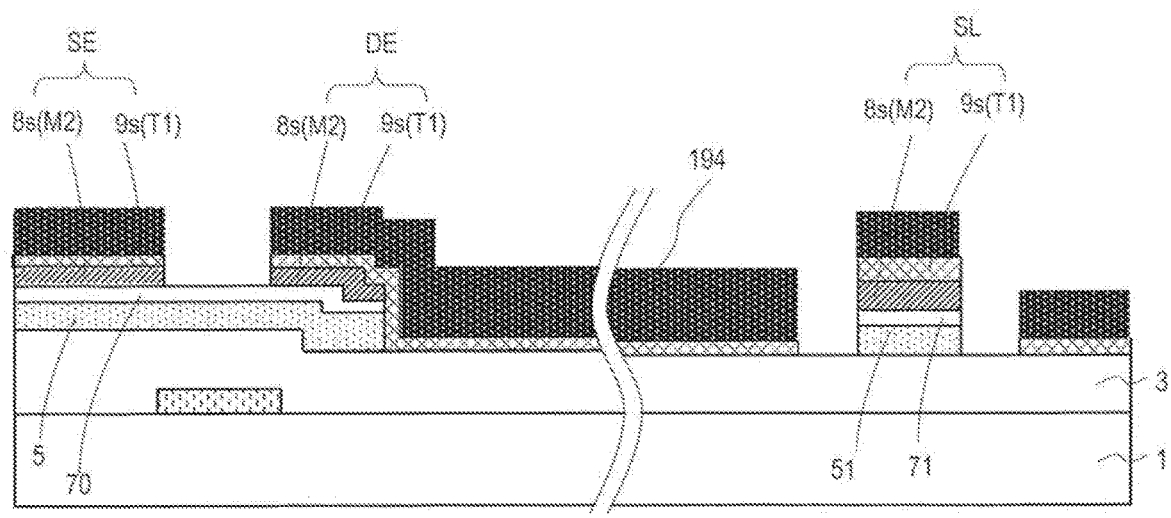
FIG. 12C is a step cross-sectional view of the TFT formation region 101 and the source bus line formation region 102 for explaining the method for manufacturing an active matrix substrate 900 of the comparative example.

According to this, as shown in FIG. 12C, the first transparent conducting layer T1, which includes the pixel electrode PE, the source bus line SL, and the upper layers 9s and 9d of the source electrode SE and the drain electrode DE, is obtained from the first transparent conducting film. Further, the source metal layer M2, which includes the source bus line SL and the lower layers 8s and 8d of the source electrode SE and the drain electrode DE, is obtained from the source conducting film.

Figure 13C:
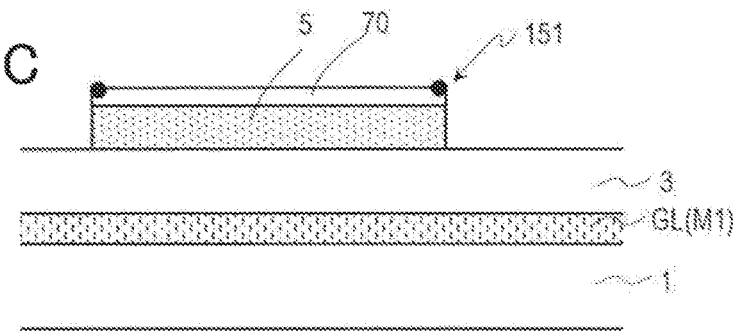
FIG. 13C is a step cross-sectional view taken across the TFT 10 in a channel width direction for explaining the method for manufacturing an active matrix substrate 900 of the comparative example.

In the cross-section shown in FIG. 13C, the first transparent conducting film 90 and the source conducting layer 81 are removed, and the semiconductor layer 5 and the contact semiconductor layer 70 remain. It should be noted that since the surface of the contact semiconductor layer 70 near the ridge is rough due to modification or the like, a wet etching solution does not sufficiently permeate through an interface between the contact semiconductor layer 70 and the first transparent conducting film 90, so that an etching residue (not illustrated) may appear.

Figure 14C:
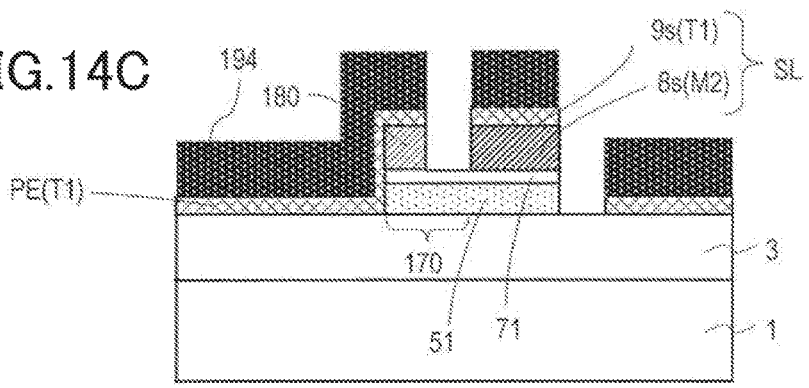
FIG. 14C is a step cross-sectional view of the etching residue appearance region 104 for explaining the method for manufacturing an active matrix substrate 900 of the comparative example.

In the etching residue appearance region 104, as shown in FIG. 14C, a portion of the source residual part 180 that is not covered with the second mask 194 is removed, so that the source residual part 180 is separated from the lower layer 8s of the source bus line SL. The pixel electrode PE is formed so as to cover a part of a laminated body composed of the semiconductor residual part 170 and the source residual part 180.

Then, the second mask 194 is utilized as-is (or the second mask 194 is removed, and the first transparent conducting layer T1 and the source metal layer M2 are used as masks) to perform thinning of the contact semiconductor layer 70 and the gate insulating layer 3 by dry etching.

Figure 12D:
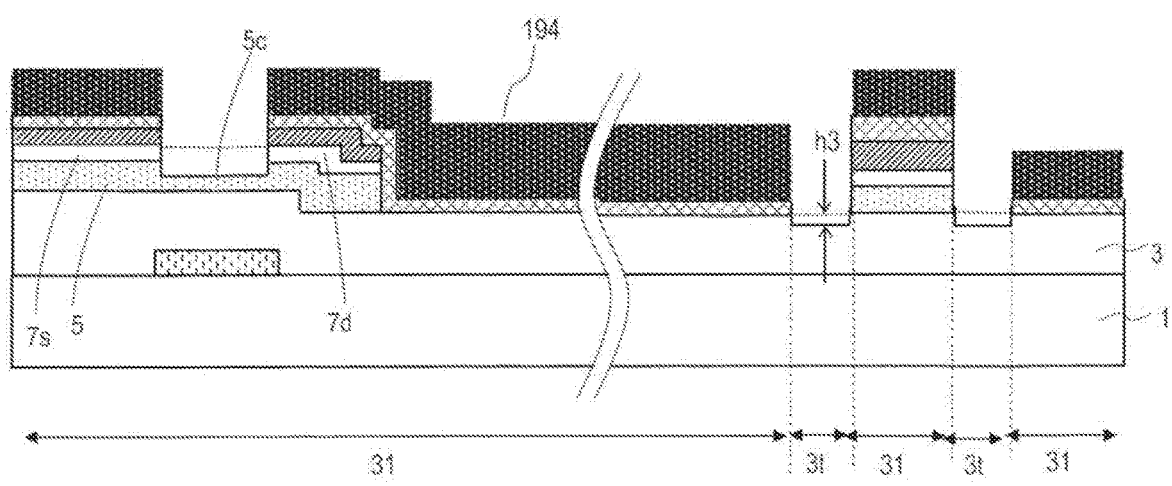
FIG. 12D is a step cross-sectional view of the TFT formation region 101 and the source bus line formation region 102 for explaining the method for manufacturing an active matrix substrate 900 of the comparative example.
Figure 13D:
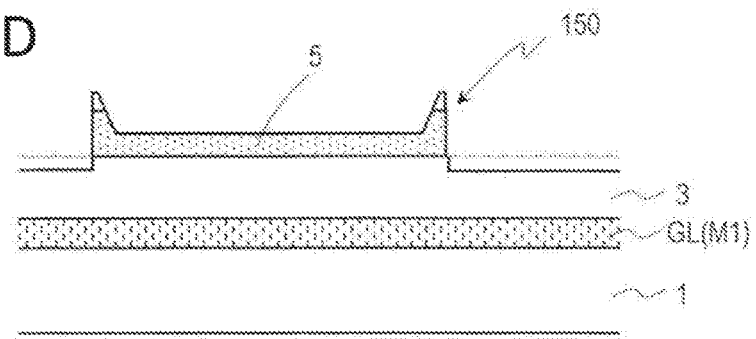
FIG. 13D is a step cross-sectional view taken across the TFT 10 in a channel width direction for explaining the method for manufacturing an active matrix substrate 900 of the comparative example.

According to this, as shown in FIGS. 12D and 13D, in the TFT formation region 101, a portion of the contact semiconductor layer 70 that is not covered with the source electrode SE or the drain electrode DE is removed, so that the semiconductor layer 5 is exposed. In this way, the source contact layer 7s and the drain contact layer 7d, which are electrically separated from each other, are obtained from the contact semiconductor layer 70.

Further, a surface portion of a region of the gate insulating layer 3 exposed from the semiconductor layer 5, the pixel electrode PE, the source bus line SL, the source electrode SE, and the drain electrode DE is removed, so that the thinned region 3t is formed in the gate insulating layer 3.

As shown in FIG. 13D, in this dry etching, the Si product 151 formed at the ridge of the contact semiconductor layer 70 is not removed but undesirably acts as a mask. Further, although not illustrated, an etching residue of the transparent conducting film too may act as a mask. As a result, a portion of the contact semiconductor layer 70 covered with the Si product 151 or the etching residue of the transparent conducting film remains in the shape of a wall without being etched. A wall-shaped film remnant 150 of the Si product is herein called "wall part".

Figure 16:
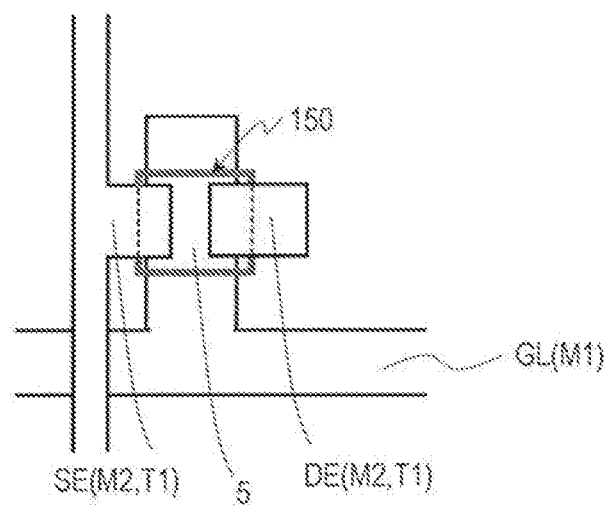
FIG. 16 is an enlarged plan view for explaining a wall part 150 formed by a Si product in the active matrix substrate 900 of the comparative example.

As shown in FIG. 16, the wall part 150 may be formed so as to make a connection between the source electrode SE and the drain electrode DE. This poses a risk that a leak may occur between the source and the drain of the TFT 10 via the wall part 150 composed of the Si product.

Figure 14D:
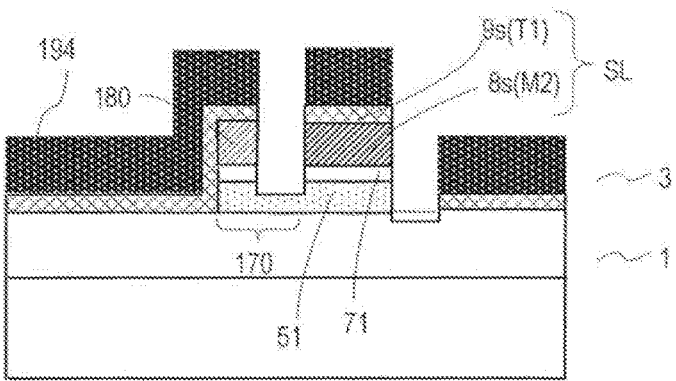
FIG. 14D is a step cross-sectional view of the etching residue appearance region 104 for explaining the method for manufacturing an active matrix substrate 900 of the comparative example.

Further, as shown in FIG. 14D, in the etching residue appearance region 104, the semiconductor residual part 170 is thinned but undesirably remains without being completely removed. This is because conditions for dry etching in this step are set to such conditions that the semiconductor layer 5 remains in a channel section. For this reason, there is a possibility that the source bus line SL may be undesirably connected to the pixel electrode PE via the second source semiconductor section 71, the first source semiconductor section 51, and the semiconductor residual part 170.

Next, although not illustrated, the dielectric layer 11 and the common electrode CE are formed. The dielectric layer 11 is for example a SiN$_x$ layer whose thickness is 750 nm. In this way, the active matrix substrate 900 of the comparative example is manufactured.

In the manufacturing method of the comparative example, as mentioned above, the second mask 194 is used to perform etching of the semiconductor residual part 170 at the same time as channel etching, with the result that the semiconductor residual part 170 is not removed through the thickness thereof. For this reason, in a case where an etching residue has appeared so as to make a connection between the source bus line formation region 102 and the pixel electrode formation region 103, there is a possibility that a leak may occur via the semiconductor residual part 170 between the pixel electrode PE and the source bus line SL.

On the other hand, according to the manufacturing method of the present embodiment, even when the semiconductor residual part 170 appears in the pixel electrode formation region 103 or the gap portion 110 between the pixel electrode PE and the source bus line SL, the semiconductor residual part 170 can be removed by the first thinning step using the first mask 191. In the first thinning step, dry etching can be performed under conditions where the semiconductor residual part 170 may be removed through the thickness thereof. Accordingly, a leak between the source bus line SL and the pixel electrode PE due to a semiconductor residual part can be prevented.

Further, in the comparative example, the second mask 194 is used to perform thinning of the gate insulating layer 3. This is the only one step of thinning the gate insulating layer 3. For this reason, in the active matrix substrate 900, only a portion of the gate insulating layer 3 that is not covered with the pixel electrode PE, the source bus line SL, or the semiconductor layer 5 is thinned, so that the thinned region 3t is formed. The pixel electrode PE is disposed over the first region 31, which has not been thinned. Thus, in the comparative example, although the thinned region 3t is formed in the gate insulating layer 3, the proportion of the area of the thinned region 3t to the entirety of each pixel region is very small, e.g. less than 20%. Further, since the etching conditions in the thinning step are restricted to conditions for channel etching (that is, the contact semiconductor layer 70 is removed and only a surface of the semiconductor layer 5 is etched), the difference in thickness h3 between the thinned region 3t and the first region 31 (i.e. the height of the stepped portion) is small, e.g. less than or equal to 40 nm.

On the other hand, in the present embodiment, in the first thinning step using the first mask 191, a region of the gate insulating layer 3 that is not covered with the source conducting layer 81 is entirely thinned. Accordingly, the thinned region 3t is formed substantially all over an opening region of each pixel. The proportion of the area of the thinned region 3t to each pixel region is for example larger than or equal to 70%, preferably larger than or equal to 90%. Further, in the present embodiment, the gate insulating layer 3 can be made thinner than in the comparative example by adjusting the etching conditions in the first thinning step. The difference in thickness between the first region 31 and the first thinned region 3t1 (e.g. the second region 32, which makes contact with the pixel electrode PE) is for example greater than or equal to 100 nm. The proportion of the thickness of the second region 32 to the thickness of the first region 31 may for example be larger than or equal to 40% and smaller than or equal to 80%.

Thus, the present embodiment makes it possible to form a wider and thinner thinned region in the gate insulating layer 3 than in the comparative example while securing the thickness of a portion of the gate insulating layer 3 located between the channel region and the gate electrode GE. This makes it possible to more effectively reduce the film stress of the gate insulating layer 3.

Furthermore, as mentioned above, the comparative example suffers from the formation of the wall part 150 composed of the Si product 151 over the semiconductor layer 5 due to the modification of a part of the contact semiconductor film.

On the other hand, in the present embodiment, the semiconductor film and the contact semiconductor film are patterned before the source conducting film is formed. The source conducting film is patterned so as to fully cover the laminated body composed of the contact semiconductor layer 70 and the semiconductor layer 5. For this reason, the semiconductor layer 5 and the contact semiconductor layer 70 are not exposed from the source conducting film thus patterned (i.e. the source conducting layer 81), so that the formation of a Si product by modification can be prevented. Accordingly, the formation of a residue of an Si product in the shape of a wall over a peripheral edge of the semiconductor layer 5 in the second thinning step is prevented.

It should be noted that Japanese Unexamined Patent Application Publication No. 2014-149410 discloses a manufacturing method which is similar to that of the comparative example. Note, however, that the method disclosed in this publication uses a resist mask for source-drain separation separately from a pixel electrode resist mask. Specifically, the pixel electrode resist mask is utilized to remove an etching residue and etch an exposed portion of a gate insulating film. After this, the resist mask for use in source-drain separation is used to form a source electrode, a drain electrode, a source contact layer, and a drain contact layer. This publication states that the aforementioned process can bring about improvement in yield attributed to an etching residue. Further, this publication states that a portion of the gate insulating film that makes contact with a dielectric layer is etched into a good surface state, whereby adhesion between the gate insulating film and the dielectric layer thereover can be improved.

In the aforementioned method, as in the case of the comparative example, the pixel electrode resist mask is used to thin only a portion of the gate insulating film exposed from the pixel electrode (i.e. only a portion of the gate insulating film that makes contact with the dielectric layer); therefore, the area of the thinned region is so small that the film stress of the gate insulating film cannot be sufficiently reduced. For this reason, there is a possibility that adhesion with the dielectric layer may decrease due to the film stress of the gate insulating film. Further, after the pixel electrode resist mask has been removed, a separate resist mask needs to be formed to perform source-drain separation and etching of a channel section. Furthermore, as in the case of the comparative example, etching of a semiconductor film is performed with a source resist mask. This may pose a problem of a leak defect attributed to a Si product.

such a laminated structure is described in International Publication No. 2016/021320 filed by the applicant. The entire content of the disclosure in International Publication No. 2016/021320 is incorporated herein by reference.

The application of the dielectric layer 11 having the aforementioned laminated structure to the active matrix substrate 100 of the present embodiment makes it possible to further effectively reduce the thickness of the dielectric layer 11. A reason for this is as follows.

In the present embodiment, since a large portion of the gate insulating layer 3 is thinned, there is a great reduction in film stress (e.g. compressive stress) that is produced in the gate insulating layer 3. Since the gate insulating layer 3 is in contact with the lower dielectric layer 11A, a reduction in film thickness of the gate insulating layer 3 leads to a reduction in stress (e.g. compressive stress) that is produced in the lower dielectric layer 11A by the gate insulating layer 3. As a result, since there is a reduction in stress (e.g. tensile stress) that is required of the upper dielectric layer 11B to cancel out the stress of the lower dielectric layer 11A, the upper dielectric layer 11B can be further thinned.

The directions, magnitudes, film characteristics, and the like of film stresses of the gate insulating layer 3, the lower dielectric layer 11A, and the upper dielectric layer 11B can be controlled by film formation conditions.

As one example, Table 1 shows a relationship between the film formation temperatures of $SiN_x$ films formed over glass substrates, film stresses, and film characteristics. Sample films A to C are $SiN_x$ films formed at temperatures of 340° C., 270° C., and 210° C., respectively. The sample films A to C each have a thickness of 500 nm.

As shown in Table 1, compressive stresses are produced in the sample films A and B formed at 340° C. and 270° C., respectively, and a tensile stress is produced in the sample film C formed at 210° C. Further, it is confirmed that the sample films A and B are higher in film density than but inferior in step coverage to the sample film C.

TABLE 1

|  | Sample Film A $SiN_x$ | Sample Film B $SiN_x$ | Sample Film C $SiN_x$ |
| --- | --- | --- | --- |
| Film Formation Temperature | 340° C. | 270° C. | 210° C. |
| Film Stress (Film Thickness: 500 nm) | Compressive Stress 430 MPa | Compressive Stress 380 MPa | Tensile Stress 100 MPa |
| Step Coverage | Low ⟶ | | High |
| Film Density | High ⟵ | | Low |

<Laminated Structure of Dielectric Layer 11>

In the present embodiment, the dielectric layer 11 may have the laminated structure including the lower dielectric layer 11A and the upper dielectric layer 11B disposed over the lower dielectric layer 11A. The lower dielectric layer 11A may be a layer having a compressive stress, and the upper dielectric layer 11B may be a layer having a tensile stress. Alternatively, the lower dielectric layer 11A may be a layer having a tensile stress, and the upper dielectric layer 11B may be a layer having a compressive stress. By thus stacking two dielectric layers that produce stresses in directions opposite to each other, the stress produced in each layer can be cancelled out, so that the dielectric layer 11 thus obtained is superior in step coverage (coatability) with respect to an underlying pattern. A dielectric layer having As can be seen from Table 1, for example, a rise in film formation temperature (substrate temperature) tends to lead to an increase in film density and a decrease in step coverage. Further, under high-temperature conditions, a compressive stress may be produced as a film stress, and under low-temperature conditions, a tensile stress may be produced as a film stress.

Using a single $SiN_x$ layer of high film density as the dielectric layer 11 leads to a decrease in coatability with respect to the underlying pattern. Meanwhile, using a single $SiN_x$ layer of low film density as the dielectric layer 11 leads to an increase in coatability, but may cause the dielectric layer 11 not to have a desired dielectric constant or insulation resistance. On the other hand, when the dielectric layer 11 has a laminated structure obtained by stacking a first layer of high film density having a compressive stress and a second layer of low film density having a tensile stress, the stresses are cancelled out, as these layers have film stresses in directions opposite to each other. This in turn makes it possible to improve coatability with respect to the underlying pattern while securing the desired characteristics.

In a case where the dielectric layer 11 has a two-layer structure composed of the first layer and the second layer, it is preferable to control the thickness of each layer to minimize the difference between the absolute value of a compressive stress produced in the first layer and the absolute value of a tensile stress produced in the second layer. This makes it possible to further enhance the coatability of the dielectric layer 11. For example, the second layer may be thicker than the first layer. Of the $SiN_x$ films of the same thickness formed in the aforementioned range of temperatures, the sample film C, which has a tensile stress, is smaller in absolute value of stress than the sample films A and B, which have compressive stresses. Accordingly, the difference in absolute value of stress can be more effectively reduced by making the second layer, which has a tensile stress, thicker than the first layer, which has a compressive stress.

A usable example of the gate insulating layer 3 is a $SiN_x$ film that is higher in film density than the dielectric layer 11. In a case where the lower dielectric layer 11A and the upper dielectric layer 11B are both silicon nitride ($SiN_x$) layers, the film formation temperature Ta of the gate insulating layer 3, the film formation temperature Tb of the lower dielectric layer 11A, and the film formation temperature of the upper dielectric layer 11B may be set to satisfy Ta>Tb>Tc. In this case, the gate insulating layer 3 and the lower dielectric layer 11A may have compressive stresses, and the upper dielectric layer 11B may have a tensile stress. The thickness of each $SiN_x$ layer is set so that the compressive stress and the tensile stress cancel out each other (that is, the difference in absolute value of stress becomes smaller). For example, the upper dielectric layer 11B may be thicker than the lower dielectric layer 11A.

Figure 8:
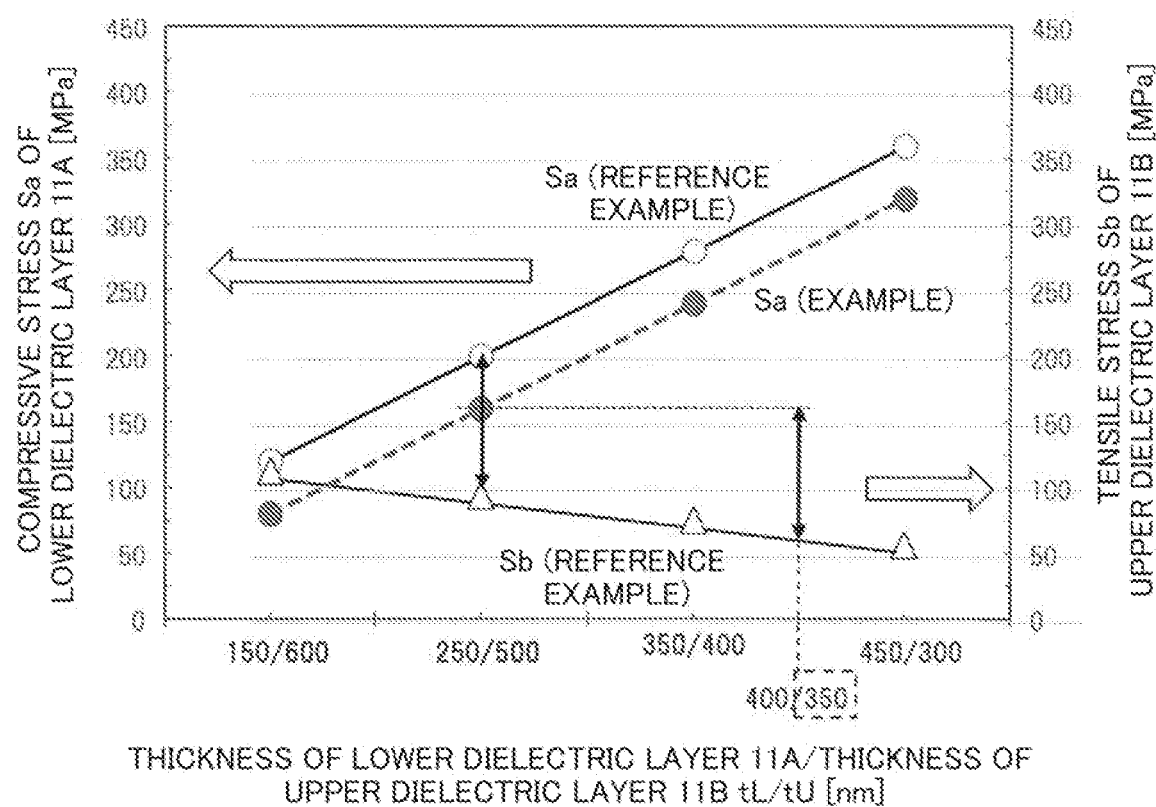
FIG. 8 is a diagram illustrating a relationship between the thicknesses and stresses of a lower dielectric layer 11A and an upper dielectric layer 11B.

FIG. 8 is a diagram illustrating a relationship between the thicknesses and stresses of the lower dielectric layer 11A and the upper dielectric layer 11B in the active matrix substrate 100.

As the gate insulating layer 3, the lower dielectric layer 11A, and the upper dielectric layer 11B, a $SiN_x$ film formed at the same film formation temperature as the sample film A, a $SiN_x$ film, formed at the same film formation temperature as the sample film B, that has a compressive stress, and a $SiN_x$ film, formed at the same film formation temperature as the sample film C, that has a tensile stress are used here, respectively.

A solid line in the graph of FIG. 8 represents a reference example illustrating a relationship between the thickness tL of the lower dielectric layer 11A and the compressive stress Sa produced in the lower dielectric layer 11A and a relationship between the thickness tU of the upper dielectric layer 11B and the tensile stress Sb produced in the upper dielectric layer 11B in a case where the gate insulating layer 3 is as thick as (here 400 nm) it was at the time of film formation.

A dotted line in the graph of FIG. 8 represents an example illustrating a relationship between the thickness tL of the lower dielectric layer 11A and the compressive stress Sa produced in the lower dielectric layer 11A in a case where the gate insulating layer 3 is as thick as (here 300 nm) it is after having been thinned.

FIG. 8 shows that with the thickness of the lower dielectric layer 11A being the same, the compressive stress Sa of the lower dielectric layer 11A is smaller in the example than in the reference example. Accordingly, the tensile stress Sb, which is used to cancel out the compressive stress Sa, can be made smaller, so that the upper dielectric layer 11B can be made thinner than in the reference example.

As one example, in the reference example, making the thickness tL of the lower dielectric layer 11A less than or equal to 250 nm and making the thickness tU of the upper dielectric layer 11B less than or equal to 500 nm makes it possible to reduce the difference in stress (i.e. the difference in absolute value of stress) between the lower dielectric layer 11A and the upper dielectric layer 11B to approximately 100 MPa. Meanwhile, in the example, making the thickness tL of the lower dielectric layer 11A 250 nm makes it possible to reduce the difference in stress (i.e. the difference in absolute value of stress) to approximately 100 MPa, even when the thickness tU of the upper dielectric layer 11B is reduced, for example, to approximately 350 nm. Thus, the example makes it possible to reduce the total thickness of the dielectric layer 11 by 150 nm while securing the same level of step coverage as the reference example.

The first layer of the dielectric layer 11 that has a compressive stress (in the example shown in FIG. 8, the lower dielectric layer 11A) may be a $SiN_x$ film whose thickness is greater than or equal to 150 nm and less than or equal to 350 nm. With a thickness greater than or equal to 150 nm, it is possible to prevent a decrease in dielectric constant or insulation resistance. With a thickness less than or equal to 350 nm, it is possible to reduce the overall thickness of the dielectric layer 11. The second layer having a tensile stress (in the example shown in FIG. 8, the upper dielectric layer 11B) may be a $SiN_x$ film whose thickness is greater than or equal to 350 nm and less than or equal to 600 nm or greater than or equal to 350 nm and less than or equal to 550 nm. With a thickness greater than or equal to 350 nm, it is possible to more effectively relax the stress of the first layer. With a thickness less than or equal to 550 nm, it is possible to reduce the overall thickness of the dielectric layer 11.

It should be noted that when the dielectric layer 11 is too thin, a leak defect tends to occur between the pixel electrode PE and the common electrode CE; therefore, the total thickness of the dielectric layer 11 (in the case of a two-layer structure, the total thickness of the lower dielectric layer 11A and the upper dielectric layer 11B) may be set to be for example greater than or equal to 500 nm or greater than or equal to 700 nm.

<Modification>

Figure 9A:
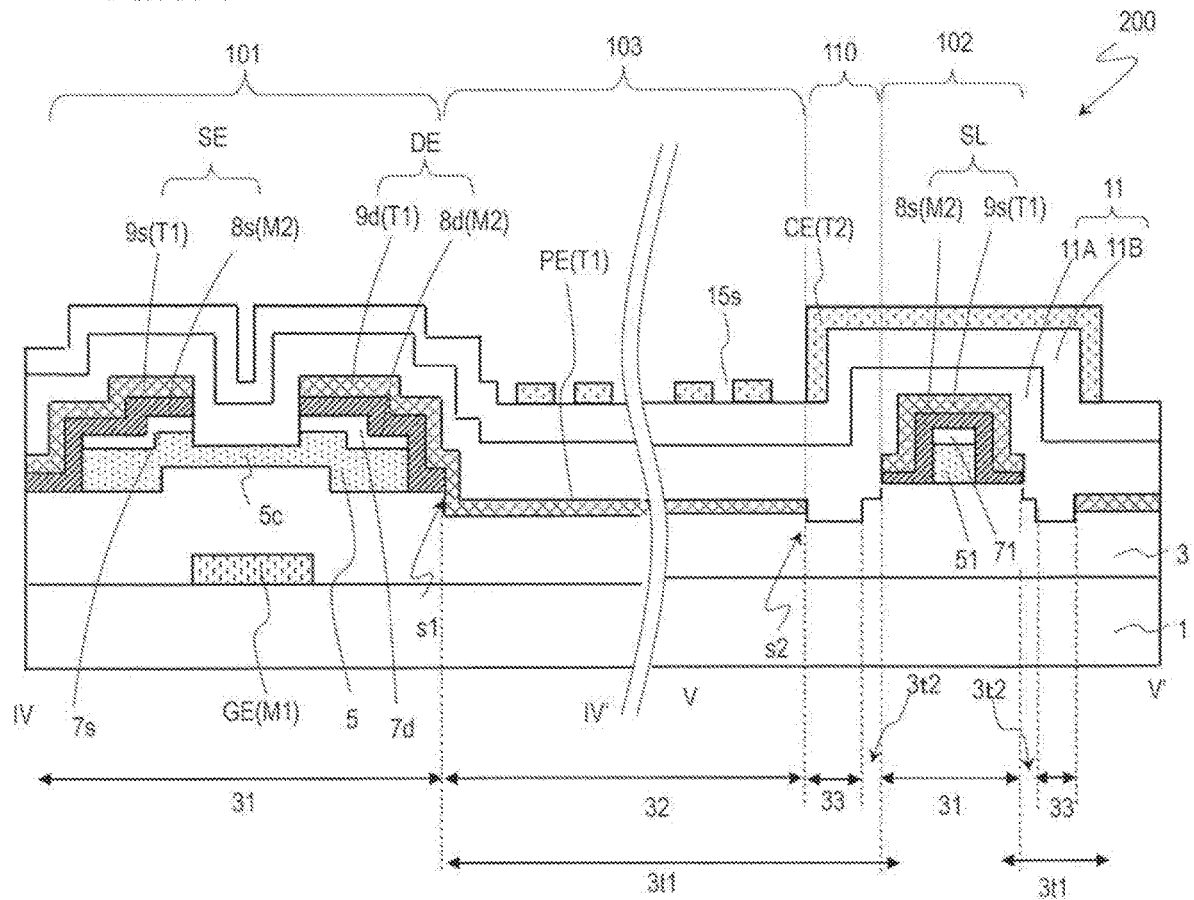
FIG. 9A is a cross-sectional view of a TFT formation region 101 and a source bus line formation region 102 in an active matrix substrate 200 of a modification.
Figure 9B:
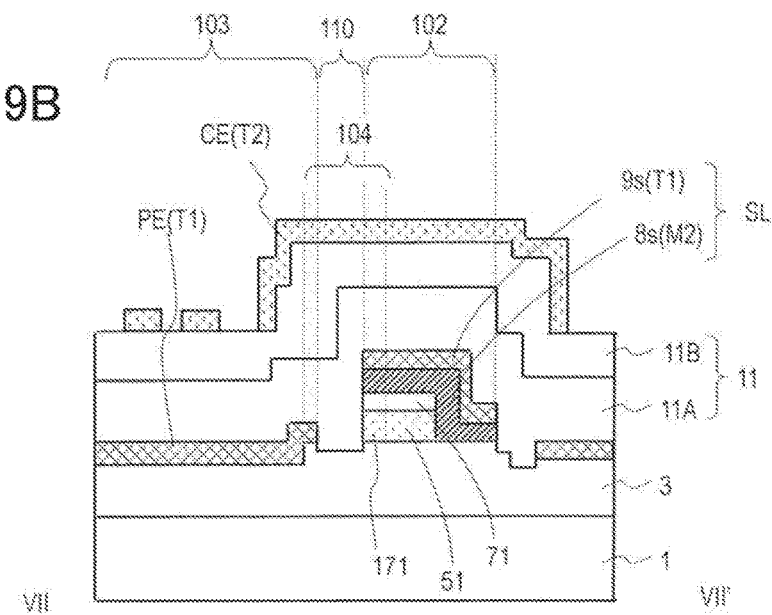
FIG. 9B is a cross-sectional view of an etching residue appearance region 104 across a source bus line SL.

FIG. 9A is a cross-sectional view of a TFT formation region 101 and a source bus line formation region 102 in an active matrix substrate 200 of a modification, and FIG. 9B is a cross-sectional view of an etching residue appearance region across a source bus line SL. A plan view is omitted, as it is similar to that of the active matrix substrate 100 (see FIG. 2A). It should be noted that FIG. 9A is a cross-sectional view taken along lines IV-IV' and V-V' shown in FIG. 2A and FIG. 9B is a cross-sectional view taken along line VII-VII' shown in FIG. 2A. A cross-sectional line taken along line VI-VI' is omitted, as it is similar to that of the active matrix substrate 100 (see FIG. 2A).

In the active matrix substrate 200, the semiconductor layer 5 is extended from the TFT formation region 101 into the source bus line formation region 102 and, in the source bus line formation region 102, is located between the source bus line SL and the substrate 1. A portion 51 of the semiconductor layer 5 located in the source bus line formation region 102 is called "first source semiconductor section". Similarly, the source contact layer 7s is extended from the TFT formation region 101 to the source bus line formation region 102 and, in the source bus line formation region 102, is disposed over the first source semiconductor section 51. A portion 71 of the source contact layer 7s located in the source bus line formation region 102 is called "second source semiconductor section". The first source semiconductor section 51 and the second source semiconductor section 71 extend in the first direction so as to overlap the source bus line SL when seen from the direction of the normal to the substrate 1.

A side surface of the first source semiconductor section 51 and a side surface of the second source semiconductor section 71 are flush with each other. The lower layer 8s and the upper layer 9s of the source bus line SL are disposed so as to fully cover upper and side surfaces of a laminated semiconductor section composed of the source semiconductor section 51 and the second source semiconductor section 71. That is, the source bus line SL covers upper and side surfaces of the second source semiconductor section 71 and a side surface of the first source semiconductor section 51 and is in contact with an upper surface of the gate insulating layer 3.

In the etching residue appearance region 104, as illustrated in FIG. 9B, the first source semiconductor section 51 and a side surface of the second source semiconductor section 71 have wider portions exposed from the source bus line SL.

FIGS. 10A to 10D are each a step cross-sectional view for explaining a method for manufacturing an active matrix substrate 200.

Figure 10A:
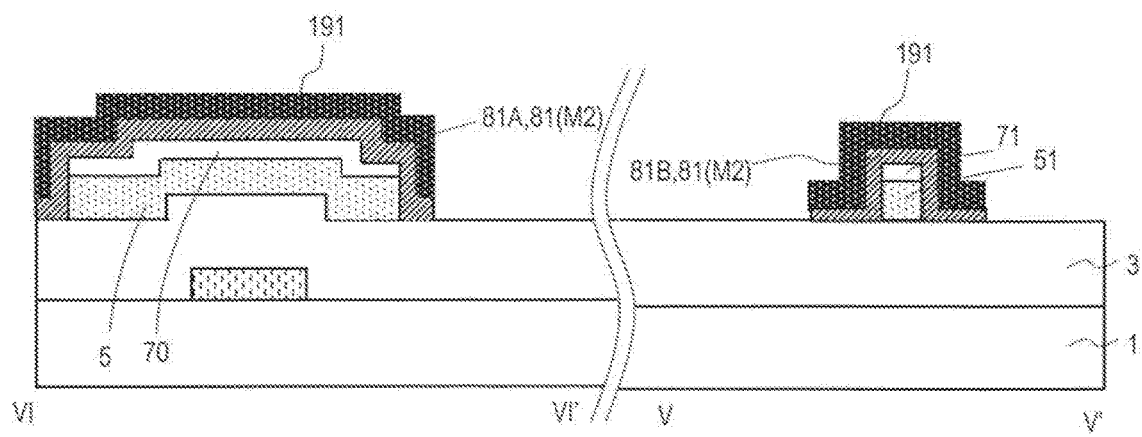
FIG. 10A is a step cross-sectional view taken along lines IV-IV' and V-V' for explaining a method for manufacturing an active matrix substrate 200.

The active matrix substrate 200 of the modification may be manufactured by a method which is similar to that by which the active matrix substrate 100 is manufactured. Note, however, that by a step of patterning a semiconductor film and a contact semiconductor film, as shown in FIG. 10A, a semiconductor layer 5 including a first source semiconductor section 51 is formed from the semiconductor film, and a contact semiconductor layer 70 including a second source semiconductor section 71 is formed from the contact semiconductor film. Next, a source conducting film is formed so as to cover the semiconductor layer 5 and the contact semiconductor layer 70, and the first mask 191 is used to perform patterning of the source conducting film. According to this, a source conducting layer 81 covering the semiconductor layer 5 and the contact semiconductor layer 70 is obtained. In the illustrated example, upper and side surfaces of a laminated semiconductor section composed of the first source semiconductor section 51 and the second source semiconductor section 71 are covered with a second source section 81B of the source conducting layer 81.

Thus, in the modification, too, as in the case of the active matrix substrate 100, the source conducting layer 81 is formed so as to fully cover a laminated body composed of the semiconductor layer 5 and the contact semiconductor layer 70; therefore, the formation of a wall part 150 (see FIGS. 13D and 16) composed of a Si product can be prevented.

Figure 10B:
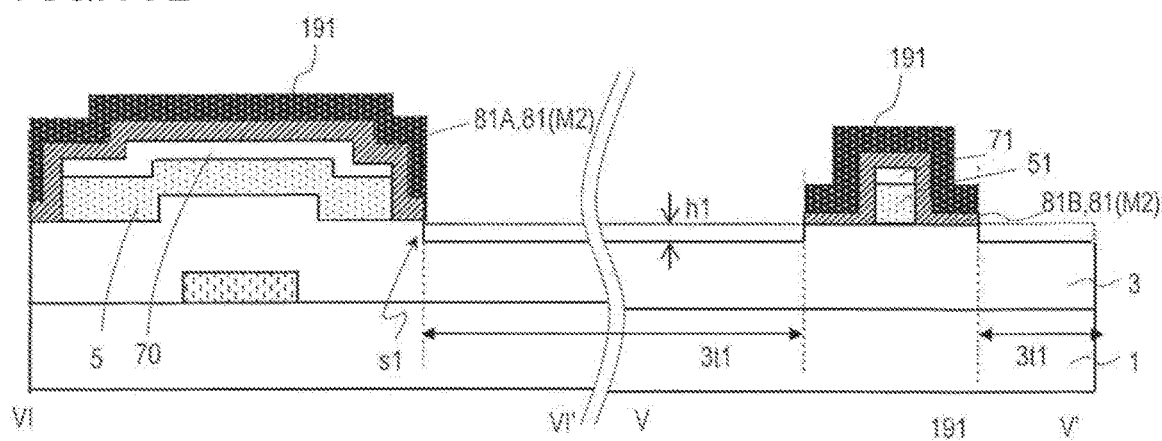
FIG. 10B is a step cross-sectional view taken along lines IV-IV' and V-V' for explaining the method for manufacturing an active matrix substrate 200.

The subsequent step is the same as that of the process for manufacturing an active matrix substrate 100. That is, as shown in FIG. 10B, the first mask 191 is utilized to execute the first thinning step on the gate insulating layer 3.

Figure 10C:
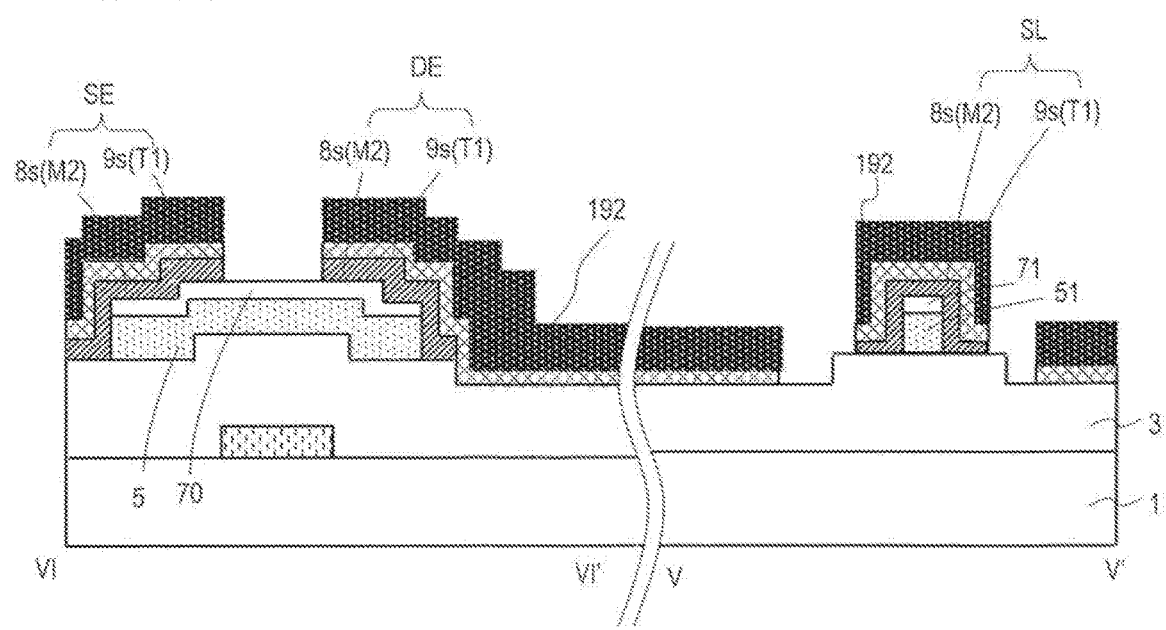
FIG. 10C is a step cross-sectional view taken along lines IV-IV' and V-V' for explaining the method for manufacturing an active matrix substrate 200.
Figure 10D:
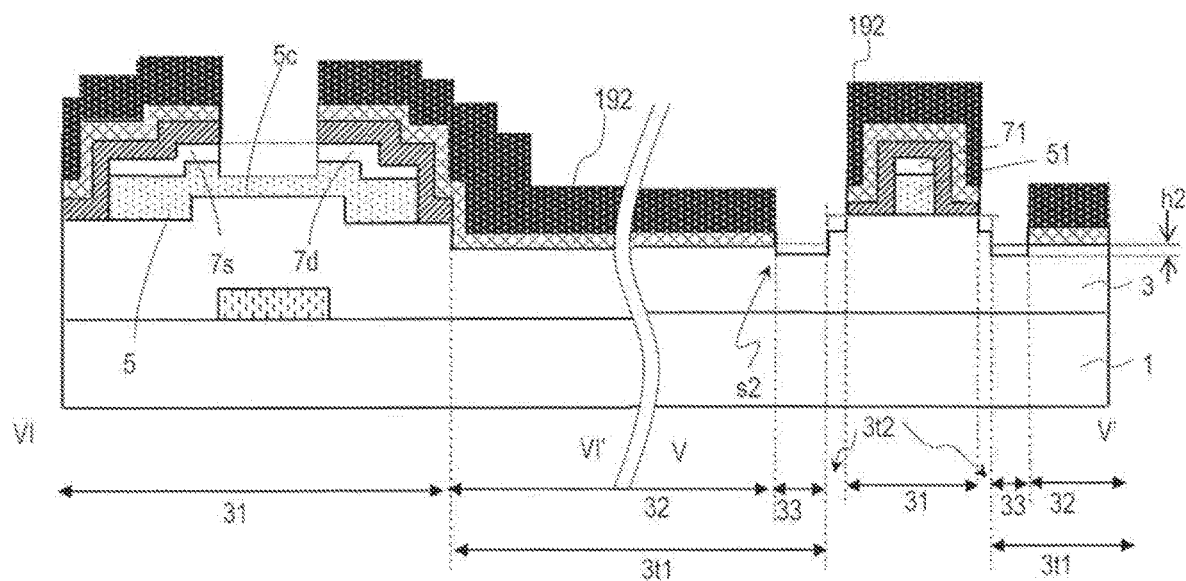
FIG. 10D is a step cross-sectional view taken along lines IV-IV' and V-V' for explaining the method for manufacturing an active matrix substrate 200.

Then, as shown in FIG. 10C, a first transparent conducting film covering the source conducting layer 81 is formed, and the second mask 192 is used to perform patterning of the first transparent conducting film and the source conducting layer 81. Furthermore, as shown in FIG. 10D, the second mask 192 is utilized to execute the second thinning step on the gate insulating layer 3. After this, the formation of the dielectric layer 11 and the formation of the common electrode CE are performed.

Further, in the modification, too, in a case where, after the patterning of the semiconductor film, a semiconductor residual part is present so as to make a connection between the source bus line formation region 102 and the pixel electrode formation region 103 in the gate insulating layer 3, a part of the semiconductor residual part is exposed from the source conducting layer 81 formed by the patterning of the source conducting film. However, as in the case of the active matrix substrate 100, the exposed portion of the semiconductor residual part is removed in the first thinning step; therefore, as shown in FIG. 9B, only the portion 171 covered with the source bus line SL remains. Since this portion 171 is electrically separated from the pixel electrode PE, a leak defect between the pixel electrode PE and the source bus line SL may be prevented.

An active matrix substrate of the present embodiment may be used in a variety of display devices such as liquid crystal display devices, organic electroluminescence (EL) display devices, inorganic electroluminescence display devices, and MEMS display devices. A display device may include an active matrix substrate, a counter substrate disposed so as to face the active matrix substrate, and a display medium layer provided between the active matrix substrate and the counter substrate. The display medium layer may be a liquid crystal layer, an organic EL layer, or the like. The active matrix substrate of the present embodiment may also be further applied to imaging devices such as image sensor devices and electronic devices such as image input devices and fingerprint reading devices.

What is claimed is:

1. A method for manufacturing an active matrix substrate having a display region including a plurality of pixel regions and including a thin-film transistor and a pixel electrode disposed in each of the plurality of pixel regions, the method comprising, in each of the plurality of pixel regions:

forming, over a substrate, a gate metal layer including a gate electrode of the thin-film transistor;

forming a gate insulating layer that covers the gate metal layer;

forming a semiconductor layer and a contact semiconductor layer of the thin-film transistor by performing patterning of a semiconductor film and a contact semiconductor film after forming the semiconductor film and then forming the contact semiconductor film over the gate insulating layer;

forming a first mask over a part of a source conducting film after forming the source conducting film such that the source conducting film covers the semiconductor layer and the contact semiconductor layer of the thin-film transistor;

forming a source conducting layer by performing patterning of the source conducting film by wet etching using the first mask, the source conducting layer covering upper and side surfaces of a laminated body comprising the semiconductor layer and the contact semiconductor layer;

performing a first thinning of the gate insulating layer via dry etching by using the first mask or by using the source conducting layer as a mask;

forming a second mask over a part of a first transparent conducting film after having formed the first transparent conducting film such that the first transparent conducting film covers the gate insulating layer and the source conducting layer;

performing patterning of the first transparent conducting layer and the source conducting layer by wet etching using the second mask to form a first transparent conducting layer from the first transparent conducting film and to form a source metal layer from the source conducting layer, the first transparent conducting layer including an upper layer of a source electrode and an upper layer of a drain electrode of the thin-film transistor, the source metal layer including a lower layer of the source electrode and a lower layer of the drain electrode of the thin-film transistor;

exposing the semiconductor layer by removing, via dry etching by using either the second mask or using the first transparent conducting layer and the source metal layer as masks, a portion of the contact semiconductor layer that is not covered with the source electrode or the drain electrode and performing a second thinning of the gate insulating layer;

forming a dielectric layer such that the dielectric layer covers the pixel electrode and the thin-film transistor and makes direct contact with an upper surface of the gate insulating layer; and forming, over the dielectric layer, a second transparent conducting layer including a common electrode.

2. The method according to claim 1, wherein the first thinning is executed under etching conditions where residues of the semiconductor film and the contact semiconductor film left over the gate insulating layer are removable through thicknesses.

3. The method according to claim 1, wherein:

forming the dielectric layer comprises forming a lower dielectric layer that makes direct contact with the upper surface of the gate insulating layer and a step of forming an upper dielectric layer over the lower dielectric layer such that the dielectric layer has a laminated structure including the lower dielectric layer and the upper dielectric layer;

either one of the lower dielectric layer and the upper dielectric layer has a compressive stress; and the other one of the lower dielectric layer and the upper dielectric layer has a tensile stress.

4. The method according to claim 3, wherein the gate insulating layer has a compressive stress, the lower dielectric layer has a compressive stress, and the upper dielectric layer has a tensile stress.

5. The method according to claim 3, wherein the gate insulating layer is a silicon nitride layer formed at a first temperature Ta, the lower dielectric layer is a silicon nitride layer formed at a second temperature Tb, the upper dielectric layer is a silicon nitride layer formed at a third temperature Tc, and the first temperature Ta, the second temperature Tb, and the third temperature Tc satisfy Ta>Tb>Tc.

6. An active matrix substrate manufactured by the method according to claim 1.

* * * * *